United States Patent
Akinwande et al.

(10) Patent No.: US 10,431,412 B2
(45) Date of Patent: Oct. 1, 2019

(54) COMPACT ION BEAM SOURCES FORMED AS MODULAR IONIZER

(71) Applicant: Massachusetts Institute of Technology, Cambridge, MA (US)

(72) Inventors: Akintunde I. Akinwande, Newton, MA (US); Stephen Angelo Guerrera, Waitsfield, VT (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/539,371

(22) PCT Filed: Dec. 23, 2015

(86) PCT No.: PCT/US2015/000468
§ 371 (c)(1),
(2) Date: Jun. 23, 2017

(87) PCT Pub. No.: WO2016/105566
PCT Pub. Date: Jun. 30, 2016

(65) Prior Publication Data
US 2018/0247784 A1    Aug. 30, 2018

Related U.S. Application Data

(60) Provisional application No. 62/096,618, filed on Dec. 24, 2014.

(51) Int. Cl.
*H01J 27/20* (2006.01)
*H01J 37/08* (2006.01)
(Continued)

(52) U.S. Cl.
CPC ............ *H01J 27/205* (2013.01); *H01J 27/26* (2013.01); *H01J 37/08* (2013.01); *H05H 3/06* (2013.01); *H01J 2237/082* (2013.01)

(58) Field of Classification Search
CPC .......... H01J 27/205; H01J 27/26; H05H 3/06
(Continued)

(56) References Cited

U.S. PATENT DOCUMENTS 3,309,616 A    3/1967  Thompson, Jr.
5,909,032 A *  6/1999  Wakalopulos .......... B29C 71/04
                                                  250/492.3
(Continued)

FOREIGN PATENT DOCUMENTS

WO    WO 2014124041 A2 *  8/2014  ............ H01J 37/065

OTHER PUBLICATIONS

International Search Report and Written Opinion for Application No. PCT/US2015/00468 dated Mar. 4, 2016.
(Continued)

*Primary Examiner* — Nicole M Ippolito
*Assistant Examiner* — Hanway Chang
(74) *Attorney, Agent, or Firm* — Wolf, Greenfield & Sacks, P.C.

(57) ABSTRACT

Example compact ion beam sources are provided that can be used to generate ion beams using chemical species and field emitter elements or field emitter arrays. In some example, the compact ion beam source can be implemented as neutron sources based on ion beam bombardment of neutron-rich targets.

20 Claims, 18 Drawing Sheets

(51) Int. Cl.
*H05H 3/06* (2006.01)
*H01J 27/26* (2006.01)

(58) Field of Classification Search
USPC ..................................... 250/423 R, 424, 427
See application file for complete search history.

(56) References Cited

U.S. PATENT DOCUMENTS

| | | | |
|---|---|---|---|
| 2004/0061051 A1 | 4/2004 | Schneiker et al. | |
| 2004/0067602 A1 | 4/2004 | Jin | |
| 2007/0114434 A1* | 5/2007 | Chang | G21K 5/04 250/400 |
| 2009/0046823 A1 | 2/2009 | Edwards et al. | |
| 2010/0065754 A1 | 3/2010 | Bromberg et al. | |
| 2013/0146221 A1 | 6/2013 | Kolmakov et al. | |
| 2014/0184074 A1* | 7/2014 | Perkins | H01J 27/04 315/111.91 |
| 2014/0209820 A1 | 7/2014 | Barry et al. | |
| 2015/0380539 A1 | 12/2015 | Colinge et al. | |

OTHER PUBLICATIONS

International Search Report and Written Opinion for Application No. PCT/US2015/00477 dated Mar. 11, 2016.
International Preliminary Report on Patentability for Application No. PCT/US2015/00468 dated Jul. 6, 2017.
International Preliminary Report on Patentability for Application No. PCT/US2015/00477 dated Jul. 6, 2017.
Bhattacharyya et al., Deep Ultraviolet emitting AlGaN quantum wells with high internal quantum efficiency. Applied Physics Letters. 2009;94:181907-1-3.
Carazzetti et al., Experimental study of electrical breakdown in MEMS devices with micrometer scale gaps. Reliability, Packaging, Testing, and Characterization of MEMS/MOEMS VII, Proc of SPIE. 2008. vol. 6884. 12pages.
Chen et al., A micro ionizer for portable mass spectrometers using double-gated isolated vertically aligned carbon nanofiber arrays. IEEE International Electron Devices Meeting—IEDM. 2007;843-6.
Chen et al., A Microionizer for Portable Mass Spectrometers Using Double-Gated Isolated Vertically Aligned Carbon Nanofiber Arrays. IEEE Trans on Electron Devices. Jul. 2011;58(7):2149-58.
Chen et al., Aperture-collimated double-gated silicon field emitter arrays. IEEE Tranactions on Electron Devices. Mar. 2007;54(3):601-8.
Cheung et al., Chip-scale Quadrupole Mass Filters for Portable Mass Spectrometry. Journal of Microelectromechanical Systems. Jun. 2010;19(3):469-83.
Chichibu et al., Origin of defect-insensitive emission probability in In-containing (Al,In,Ga)N alloy semiconductors. Nature Materials. Oct. 2006;5:810-6.
Chuang., Optical gain of strained wurtzite GaN quantum-well lasers. IEEE Journal of Quantum Electronics. Oct. 1996;32(10):1791-1800.
Ding et al., Highly uniform and low turn-on voltage Si field emitter arrays fabricated using chemical mechanical polishing. IEEE Electron Device Letters. Feb. 2000;21(2):66-9.
Ding et al., Silicon Field Emission Arrays with Atomically Sharp Tips: Turn-on Voltage and the Effect of Tip Radius Distribution. IEEE Transactions on Electron Devices. Dec. 2002;49(12):2333-42.
Dogan et al., Dense array slab-coupled optical waveguide laser capable of 500W/bar. Proceedings of SPIE. 2014; 8965: 89650L-1-7.
Dougal et al., High Performance Micropane Electron Beam Window. Journal of Vacuum Science & Technology B. Nov./Dec. 2000;18(6):2750-6.
Dvorson et al., Electrical and optical characterization of field emitter tips with integrated vertically stacked focus. IEEE Transactions on Electron Devices. Dec. 2003;50(12):2548-58.
Fan et al., Improve power conversion efficiency of slab coupled optical waveguide lasers. Optics Express. Jul. 2014;22(15):17666-72.
Fomani et al., Challenges of High Vacuum Pumping based on Impact Ionization and Ion Implantation Process. Tech Digest of the 27th International Vacuum Nanoelectronics Conference. Jul. 2014. 2pages.
Fomani et al., Low-Voltage Field Ionization of Gases Up to Torr-Level Pressures Using Massive Arrays of Self-Aligned Gated Nanoscale Tips. IEEE Trans on Electron Devices. May 2014;61(5):1520-8.
Fomani et al., Toward Amp-Level Field Emission With Large-Area Arrays of Pt-Coated Self-Aligned Gated Nanoscale Tips. IEEE Transactions on Electron Devices. Jul. 2014;61(7):2538-46.
Gassend et al., A microfabricated planar electrospray array ionic liquid ion source with integrated extractor. Journal of Microelectromechanical Systems. Jun. 2009;18(3):679-94.
Gassend et al., Precision in-plane hand assembly of bulk-microfabricated components for high-voltage MEMS arrays applications. Journal of Microelectromechanical Systems. Apr. 2009;18(2):332-46.
Guerrera et al., Improved Field Emitter Arrays with Integrated Vertical Curent Limiters and Self-Aligned Gate Apertures. Tech Digest of 2014 27th International Vacuum Nano Conf, INVC. Jul. 2014. 2pages.
Guerrera et al., Scaling of high-aspect-ratio current limiters for the individual ballasting of large arrays of field emitters. IEEE Transactions on Electron Devices. Sep. 2012;59(9):2524-30.
Guerrera et al., Self-aligned, gated field emitter arrays with integrated high-aspect-ratio current limiters. 2013 26th International Vacuum Nanoelectronics Conf, IVNC. Jul. 2013. 2pages.
Hoke et al, Thermodynamic analysis of cation incorporation during molecular beam epitaxy of nitride films using metal-rich growth conditions. Journal of Vacuum Science and Technology B. May/Jun. 2007;25(3):978-82.
Iliopoulos et al., Growth kinetics of AlGaN films by plasma-assisted molecular-beam epitaxy. Applied Physics Letters. Jul. 2002;81(2):295-7.
Jacob, Penetration and energy deposition of electrons in thick targets. Journal of Applied Physics. Jan. 1974;45(1):467-75.
Johnson et al., Field ionization characteristics of an ion source array for neutron generators. Journal of Applied Physics. 2013;114:174906-1-9.
Johnson, A Microfabricated Deuterium Ion Source for Compact Neutron Generators. Dissertation submitted to the University of New Mexico. May 2013. 216 pages.
Krimmel et al., Si Silicon: Silicon Nitride in Microelectronics and Solar Cells. Gmelin Handbook of Inorganic and Organometallic Chemistry. 1991;8.
Lochner et al., Deep-ultraviolet lasing at 243 nm from photo-pumped AlGaN/AlN heterostructure on AlN substrate. Applied Physics Letters. 2013;102:101110-1-4.
Matsumoto et al., Handheld deep ultraviolet emission device based on aluminum nitride quantum wells and graphene nanoneedle field emitters. Optics Express. Oct. 2012; 20(22): 24320-9.
Moustakas et al., Experimental Evidence that the Plasma-assisted MBE Growth of Nitride Alloys is a Liquid Phase Epitaxy Process. ECS Transactions. 2011;35(6):63-71.
Moustakas et al., The role of liquid phase epitaxy during growth of AlGaN by MBE. Phys Status Solidi C. 2012;9(3-4):580-3.
Moustakas., The role of extended defects on the performance of optoelectronic devices in nitride semiconductors. Physica Status Solidi A. 2013;210(1):169-74.
Nguyen et al., AirSEM: Electron Microscopy in Air, without a Speciman Chamber. Microscopy and Microanalysis. 2013;19(Suppl 2):428-9. doi:10.1017/S1431927613004133.
Nikiforov et al., Evidence of deep ultraviolet amplified spontaneous emission in electron beam pumped AlGaN multiple-quantum-well-based structures. Lester Eastman Conference on High Performance Devices (LEC). 2012. 4pages. DOI: 10.1109/lec.2012.6410975.
Nishiyama et al., Atmospheric scanning electron microscope observes cells and tissues in open medium through silicon nitride film. Journal of Structural Biology. 2010;169:438-49.

(56) References Cited

OTHER PUBLICATIONS

Nix et al., Crystallite coalescence: A mechanism for intrinsic tensile stresses in thin films. Journal of Materials Research. Aug. 1999;14(8):3467-73.
Oto et al., 100 mW deep-ultraviolet emission from aluminum-nitride-based quantum wells pumped by an electron beam. Nature Photonics. Nov. 2010;4:767-70.
Pearsall, GaInAsP Alloy Semiconductors. Wiley. 1982;47.
Pecora et al., Polarization properties of deep-Ultraviolet optical gain in Al-rich AlGaN structures. Applied Physics Express. 2012;5:032103-1-3.
Pecora et al., Sub-250 nm light emission and optical gain in AlGaN materials. Journal of Applied Physics. 2013;113:0133106-1-7.
Pecora et al., Sub-250nm Room-Temperature Optical Gain from AlGaN/AlN Multiple Quantum Wells with Strong Band-Structure Potential Fluctuations. Applied Physics Letters. 2012;100:061111-1-4.
Persaud et al., A compact neutron generator using a filed ionization sources. Review of Scientific Instruments. 2012;83:02B312-1-4.
Pflug et al., Field Emitter Arrays for Low Voltage Applications with sub 100 nm apertures and 200 nm period. Tech Digest of the IEEE International Electron Device Meeting. Dec. 2001. 4 pages.
Reichenbach et al., The field evaporation of deuterated titanium as neutron generator ion source. Journal of Applied Physics. 2010;108:094903-1-9.
Reijonen et al., rf ion source development for neutron generation and for material modificiation. Review of Scientific Instruments. Feb. 2002;73(2):934-6.
Riley et al., Helium detection via field ionization from carbon nanotubes. Nano Letters. 2003;3(10):1455-8.
Rokni et al., Dominant formation and quenching processes in E-beam pumped ArF* and KrF* lasers. Physical Review A. Dec. 1977;16(6). 10 pages.
Southon et al., Current-voltage Characteristics of Helium Field-ion Microscope. Philosophical Magazine: A Journal of Theoretical Experimental and Applied Physics. 1963;579-91.
Spindt et al., Physical properties of thinfilm field emission cathods with molybdenum cones. Journal of Applied Physics. Dec. 1976;47(12):5248-63.
Suga et al., The Atmospheric Scanning Electron Microscope with open sample space observes dynamic phenomena in liquid or gas. Ultramicroscopy. 2011;111:1650-8.
Sun et al., Development of AlGaN-based graded-index-separate-confinement-heterostructure deep UV emitters by molecular beam epitaxy. Journal of Vacuum Science & Technology B. May/Jun. 2013;31(3):03C117-1-7.

Takano et al., Room-temperature deep-ultraviolet lasing at 241.5 nm of AlGaN multiple-quantum-well laser. Applied Physics Letters. May 2004;84(18):3567-9.
Tiberi et al., Electron beam pumped lasers based on II-VI compound nanostructures. Phys Status Solidi B. 2010;247(6):1547-52.
Tsujino et al., Nanosecond pulsed field emission form-gate metallic field emitter arrays fabricated by molding. Journal of Vacuum Science and Technology B. Mar/Apr. 2011;29(2):02B117-1-7.
Velasquez-Garcia et al., CNT-Based MEMS/NEMS Gas Ionizers for Portable Mass Spectrometry Applications. Journal of MicroElectroMechanical Systems. Jun. 2010;19(3):484-93.
Velasquez-Garcia et al., CNT-based gas ionizers with integrated MEMS gate for portable mass spectrometry applications. 15th International Conference on Solid-State Sensors, Actuators and Microsystem Transducers. Jun. 21-25, 2009. 4 pages.
Velasquez-Garcia et al., Uniform High Current Field Emission of Electrons from Si and CNF FEAs individually controlled by Si Pillar Ungated FETs. IEEE International Electron Device Meeting Technical Digest. 2007; 599-602.
Velasquez-Garcia et al., Uniform High-Current Cathods Using Massive Arrays of Si Field Emitters Individually Controlled by Vertical Si Ungated FETs—Part 1: Device Design and Simulation. IEEE Transactions on Electron Devices. Jun. 2011;58(6):1775-82.
Velasquez-Garcia et al., Uniform High-Current Cathods Using Massive Arrays of Si Field Emitters Individually Controlled by Vertical Si Ungated FETs—Part 2: Device Fabrication and Characterization. IEEE Transactions on Electron Devices. Jun. 2011;58(6):1783-91.
Venus et al., High-brightness narrow-line laser diode source with volume Bragg-grating feedback. Proceedings of SPIE 5711, High-Power Diode Laser Technology and Applications III. Mar. 2005;5711:166-76.
Wu, Development of a Compact Neutron Generator to be Used for Associated Particle Imaging Utilizing a RF-Driven Ion Source. UC Berkeley Electronic Theses and Dissertations. 2009. 126pages.
Wunderer et al., Optically pumped UV lasers grown on bulk AlN substrates. Physica Status Solidi C. 2012;9(3-4):822-5.
Wunderer et al., Pseudomorphically Grown Ultraviolet C Photopumped Lasers on Bulk AlN Substrates. Applied Physics Express. 2011;4:092101-1-3.
Zhang et al., Molecular beam epitaxy growth of AlGaN quantum wells on 6H-SiC substrates with high internal quantum efficiency. Journal of Vacuum Science and Technology B. May/Apr. 2012;30(2):02B119-1-5.

\* cited by examiner

COMPACT ION BEAM SOURCES FORMED AS MODULAR IONIZER

CROSS-REFERENCE TO RELATED APPLICATION

This application is a National Stage Application under 35 U.S.C. § 371 of International Application Serial No. PCT/US2015/000468, filed Dec. 23, 2015, entitled "Compact Ion Beam Sources Formed as Modular Ionizer," which claims a priority benefit to U.S. Provisional Application No. 62/096,618, filed on Dec. 24, 2014, entitled "MEMS Ionizers for Compact Neutron Sources," each of which is hereby incorporated by reference in its entirety for all purposes.

GOVERNMENT SUPPORT

This invention was made with Government support under Grant No. HR0011-15-2-0012 awarded by the Defense Advanced Research Projects Agency (DARPA). The government has certain rights in the invention.

BACKGROUND

Commercially available high current ion sources are based on microwave plasma generation, typically powered by a magnetron. They have demonstrated very high currents (>100 mA $D^+$) and high current density (>350 $mA/cm^2$). Most commercial available plasma sources are based on an electron cyclotron resonance (ECR) process to increase the ion density in a plasma. The ECR process requires high magnetic fields and hence large magnets. While they are able to reach high current density and high ion current, they consume a lot of power (kW) and are not power efficient. They also have large footprint (volume and "linear" dimensions) and heavy weight due to the associated components, such as microwave power supplies, matching networks and magnets. They often require significant thermal management and liquid cooling. Efforts to reduce the size of these types of RF ion source have focused on operating the microwave plasma devices in the inductively coupled mode to increase the atomic ion fraction in the plasma. By reducing the power required, the size of the power supply could be reduced. However, a microwave power supply fundamentally still requires huge infrastructure, and there is still a huge power, size and weight overhead for generating ions. Hence, they are not viable options as portable ion sources.

SUMMARY

According to the systems, methods, apparatus described herein, compact ion beam source formed with modular ionizers are provided. The modular ion beam sources are formed from field emitter elements disposed in a modular housing, where the modular housing formed with a window that is selectively transmissive to an electron beam, or the ion beam, or both, and that has low permeability to gasses including oxidizing gaseous species.

The example systems, methods, and apparatus are configured to generate an ion beam through either a process of field ionization, or a process of electron impact ionization, or some combination of the two processes.

In an example, the modular ionizer can be formed from one or more field emitter arrays, each array including a plurality of individually switched field emitter elements serving as a nanoscale electron sources. Any example field emitter array herein can be configured for spatial and/or temporal switching of selective field emitter elements of the field emitter arrays.

Example systems, methods, and apparatus herein provide an example compact ion beam source that includes an electron beam unit and a chemical species source. The electron beam unit includes a modular housing unit that is selectively impermeable to gasses including oxidizing gaseous molecules, an electron beam source disposed in the modular housing unit, and at least one anode component disposed in the modular housing unit. The modular housing unit includes a base portion and a window that is selectively transmissive to electrons. The electron beam source includes at least one field emitter element having a first end disposed over the base portion and a field emitter tip disposed proximate to a second end that is opposite to the first end, and at least one gate electrode disposed proximate to the second end of the at least one field emitter element. The at least one gate electrode is used to apply a potential difference proximate to the field emitter tip of the at least one field emitter elements, thereby extracting electrons from the at least one field emitter tip to form an electron beam. The at least one anode component is disposed in the modular housing unit and is configured to accelerate the electron beam in a path directed at the window of the modular housing unit. The chemical species source is disposed proximate to the window of the electron beam unit, to provide at least one chemical species that is ionizable on exposure to the electron beam to produce the ion beam.

Example systems, methods, and apparatus herein provide an example compact ion beam source that includes a modular housing unit including a base portion and at least one chemical species disposed proximate to the field emitter tip. A first end of at least one field emitter element is disposed over the base portion, and a field emitter tip is disposed proximate to a second end that is opposite to the first end. At least one gate electrode is disposed proximate to the second end of the at least one field emitter element. The at least one chemical species is disposed proximate to the field emitter tip. The at least one chemical species is ionizable to produce an ion beam in response to a positive potential difference being at the field emitter tip of the at least one field emitter element relative to the at least one gate electrode.

The modular housing unit of the example compact ion source can include a window that is selectively transmissive to the ion beam.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 1:
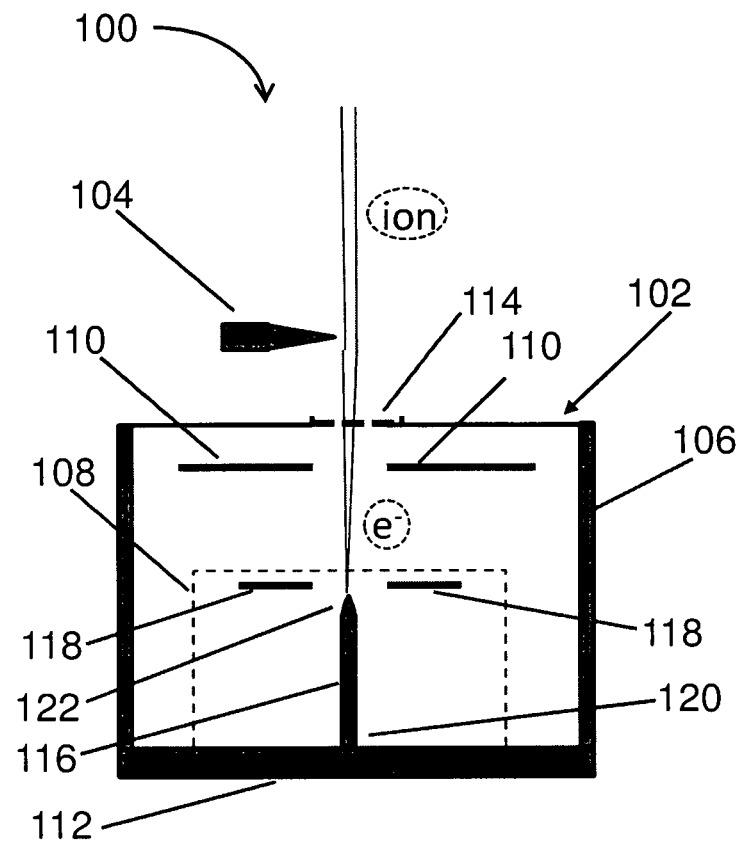
FIG. 1 shows a cross-sectional view of an example compact ion beam source, according the principles herein.

The features and advantages of the present invention will become more apparent from the detailed description set forth below when taken in conjunction with the drawings.

DETAILED DESCRIPTION

Following below are more detailed descriptions of various concepts related to, and embodiments of, inventive systems, methods and apparatus for providing example compact ion beam source including field emitters, and example neutron sources based on the compact ion beam source. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

It also should be appreciated that all combinations of the concepts discussed in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the particular concepts disclosed herein.

As used herein, the term "includes" means includes but is not limited to, the term "including" means including but not limited to. The term "based on" means based at least in part on.

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

As used herein, the term "chemical species" encompasses atoms, molecules, molecular fragments, and ions. The chemical species can be in the form of a solid, liquid, or gas.

Example systems, methods, and apparatus herein provide compact ion beam source that can be used to generate ion beams using field emitter elements or field emitter arrays.

The example compact ion beam source according to the principles herein exhibit increased lifetime and performance by introducing features that act to focus the electron or ion beam and protect the field emitter tips from bombardment by back streaming ions.

The instant disclosure also describes example systems, methods, and apparatus for fabrication of self-aligned single-gate or double-gate high aspect ratio field emitter tip structures, reduction of emitter tip damage from back ion bombardment, and reduction of the likelihood of premature dielectric breakdown due to high voltage operation, especially in the field ionization mode.

The example compact ion beam source can be configured to generate the ion beams based on an electron impact ionization mechanism or a field ionization mechanism.

In an example of operation based on an electron impact ionization mechanism, a chemical species is exposed to an electron beam from the field emitter elements. The impact of the electron beam with the chemical species causes ionization based on the electron impact ionization mechanism, to generate the ions. The collisions can be elastic or inelastic, resulting in the creation of ions or reactive excited radicals. In some examples, the energy of the electron beam can be transferred to cause promotion of electrons of molecules of the chemical species to higher energy levels, thereby creating excited radicals. The ions resulting from the electron impact ionization mechanism can be used for processes such as reactive ion etching.

In an example of operation based on a field ionization mechanism, the ions form from the chemical species that is within the vicinity of the potential difference generated between emitter tip of the field emitter element and the gate electrode. A positive potential difference generated between the gate electrode and the field emitter tip causes electron tunneling from the chemical species to the field emitter tip, resulting in ionization of the chemical species and generation of the ions.

The example systems, methods and apparatus herein provide spatial and temporal control of the ion beam emissions from the compact ion beam sources.

In a non-limiting example, the compact ion beam source can be formed into neutron sources based on ion beam bombardment of neutron-rich targets.

FIG. 1 shows a cross-sectional view of an example compact ion beam source 100 according the principles taught herein. The example compact ion beam source 100 includes an electron beam unit 102 and a chemical species source 104. The example electron beam unit 102 includes a modular housing unit 106 that is selectively impermeable to gasses (including oxidizing gaseous molecules), an electron beam source 108 disposed in the modular housing unit, and at least one anode component 110 disposed in the modular housing unit 106. The modular housing unit 106 includes a base portion 112 and a window 114 that is selectively transmissive to electrons. The electron beam source 108 includes at least one field emitter element 116 disposed over the base portion 112 and at least one gate electrode 118. Field emitter element 116 is formed with a first end 120 disposed proximate to the base portion 112 and a second end formed with a field emitter tip 122. The gate electrode 118 is disposed proximate to the second end of the field emitter element 116, and is used to apply a potential difference proximate to the field emitter tip, thereby extracting electrons from the at least one field emitter tip, through electron tunneling, to form the electron beam (e⁻) emitted from the electron beam source 108. The anode component 110 is configured to accelerate the electron beam in a path directed at the window 114 of the modular housing unit 106. The chemical species source 104 is disposed proximate to the window of the electron beam unit, and provides at least one chemical species that is ionizable to produce an ion beam on exposure to the electron beam.

Figure 2:
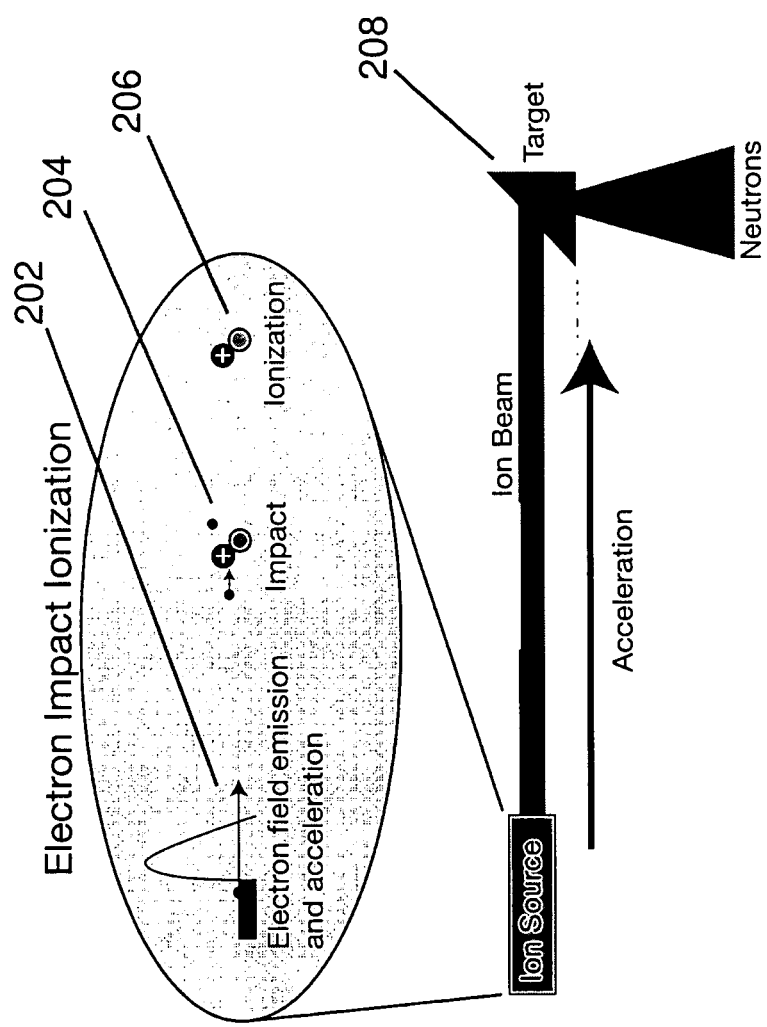
FIG. 2 shows an example mechanism for generating an ion beam using electron impact ionization, according the principles herein

FIG. 2 shows an example mechanism for generating an ion beam using electron impact ionization. In this mechanism, an electron beam 202 from an electron beam source is accelerated towards the chemical species 204 from a chemical species source. As shown in FIG. 2, the impact of the electron beam with the chemical species causes ionization 206 that generates the ion beam. In a non-limiting example implementation, the example compact ion beam source of FIG. 1 can be used to generate an ion beam based on the electron impact ionization mechanism. As also shown in FIG. 2, a neutron-rich target 208 can be dispose in the emission path of the ion beam, such that the interaction of the ion beam with the neutron-rich target generates a neutron beam.

Figure 3A:
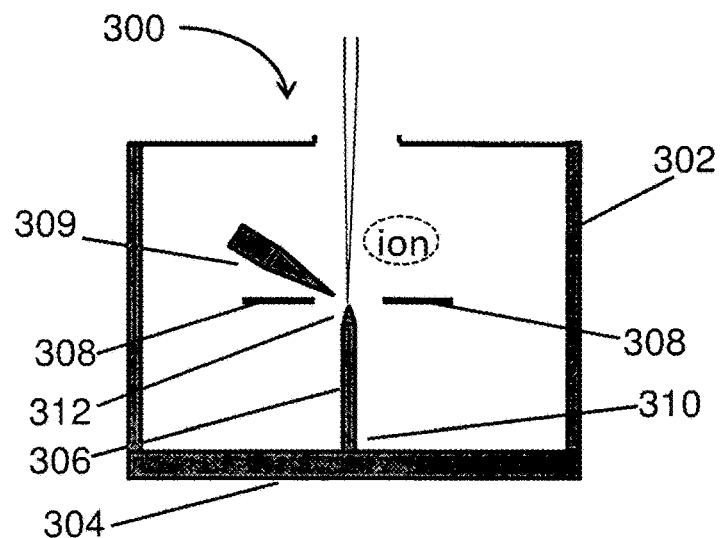
FIG. 3A shows a cross-sectional view of another example compact ion beam source, according the principles herein

FIG. 3A shows a cross-sectional view of another example compact ion beam source 300 according the principles taught herein. The compact ion beam source 300 includes a modular housing unit 302 including a base portion 304. The compact ion beam source 300 also includes at least one field emitter element 306 disposed over the base portion 304, at least one gate electrode 308, and a chemical species source 309. Field emitter element 306 is formed with a first end 310 disposed proximate to the base portion 304 and a second end formed with a field emitter tip 312. The gate electrode 308 is disposed proximate to the second end of the field emitter element 306, and is used to apply a potential difference between the gate electrode 308 and the field emitter tip 312. The chemical species source 309 provides at least one chemical species proximate to the field emitter tip 312 that is ionizable to produce an ion beam in response to a positive potential difference being at the field emitter tip 312 of the at least one field emitter element 306 relative to the gate electrode 308.

Figure 3B:
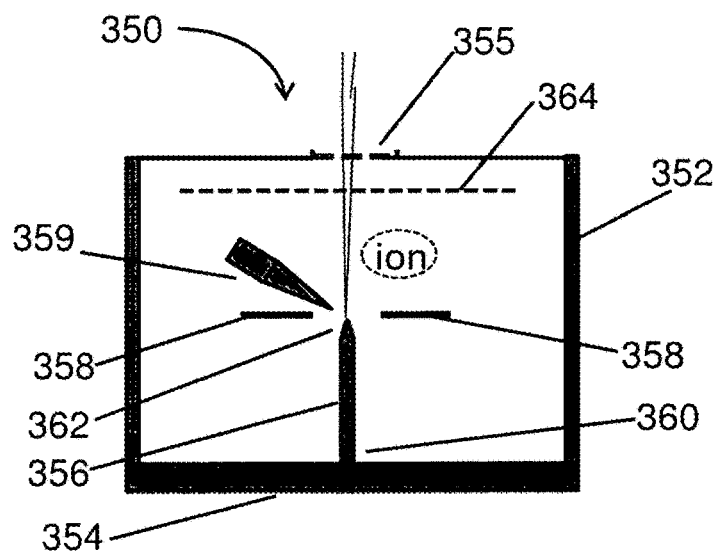
FIG. 3B shows a cross-sectional view of another example compact ion beam source, according the principles herein

FIG. 3B shows a cross-sectional view of another example compact ion beam source 350 according the principles taught herein. The compact ion beam source 350 includes a modular housing unit 352 including a base portion 304 and a window 355 that is selectively transmissive to the ion beam. The compact ion beam source 350 also includes at least one field emitter element 356 disposed over the base portion 354, at least one gate electrode 358, and a chemical species source 359. Field emitter element 356 is formed with a first end 360 disposed proximate to the base portion 354 and a second end formed with a field emitter tip 362. The gate electrode 358 is disposed proximate to the second end of the field emitter element 356, and is used to apply a potential difference between the gate electrode 358 and the field emitter tip 362. The chemical species source 359 provides at least one chemical species proximate to the field emitter tip 362 that is ionizable to produce an ion beam in response to a positive potential difference being at the field emitter tip 362 of the at least one field emitter element 356 relative to the gate electrode 358. The example of FIG. 3B also may include an optional collector component 364 disposed in the modular housing unit 352 and configured to apply a lower potential than the gate electrode 358, to accelerate the ion beam towards the window.

In any example implementation according to the principles of FIG. 3A or 3B, at least one collector component can be disposed in the modular housing unit and configured to apply a lower potential than the gate electrode to accelerate the ion beam.

The type of ion beam generated through a field ionization process can depend on the magnitude of the positive potential difference established. As a non-limiting examples, a field of about $2.5 \times 10^8$ V/cm (or about 25 V/nm) can be used to generate $H^+$ or $D^+$ ions, rather than $H^{2+}$ or $D^{2+}$ ions.

Figure 4:
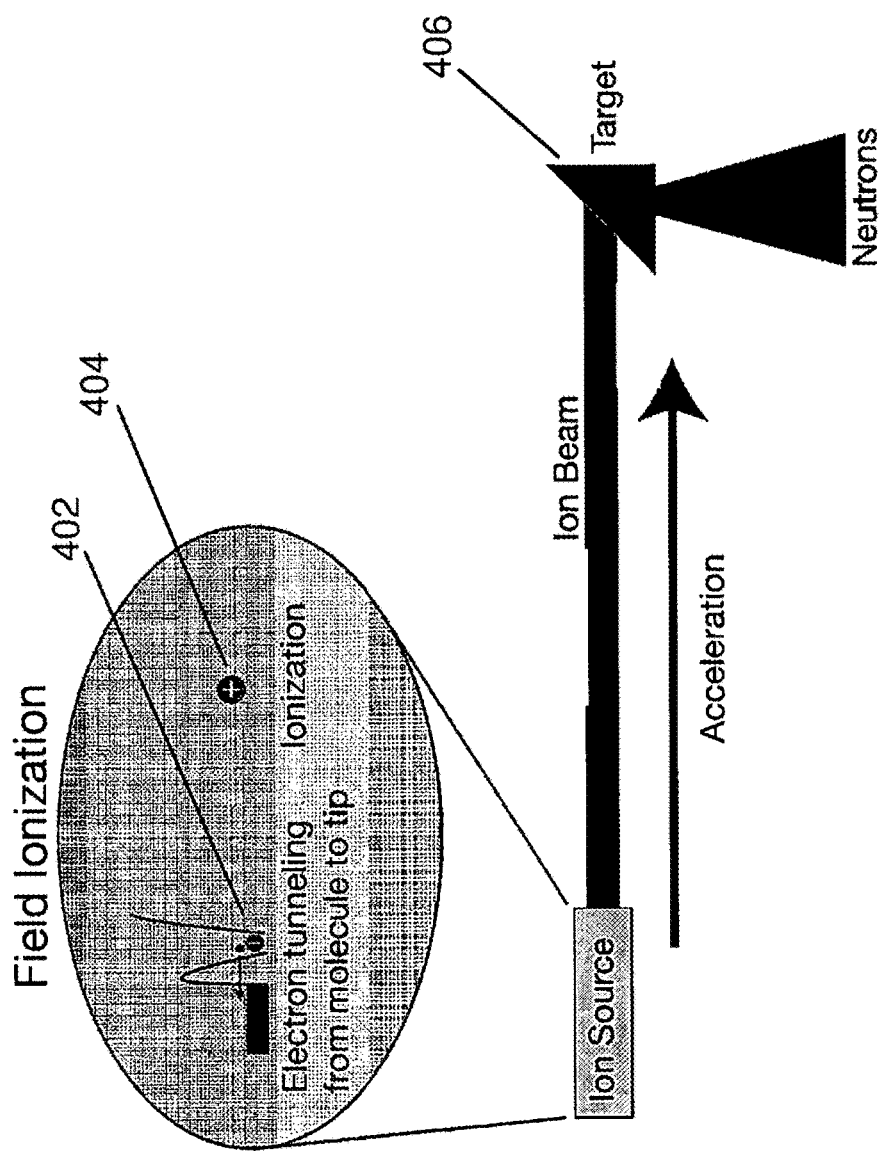
FIG. 4 shows an example mechanism for generating an ion beam using field ionization, according the principles herein

FIG. 4 shows an example mechanism for generating an ion beam using field ionization. In this example, a chemical species source is used to provide at least one chemical species proximate to the field emitter tip of a field emitter element. In this mechanism, a positive potential difference between the gate electrode and the field emitter tip causes electron tunneling 402 from the chemical species to the field emitter tip, resulting in ionization 404 to provide the ions. The ions are accelerated away from the gate electrode as an ion beam. In a non-limiting example implementation, the example compact ion beam source of FIG. 3A or 3B can be used to generate an ion beam based on this mechanism. As also shown in FIG. 4, a neutron-rich target 406 can be dispose in the emission path of the ion beam to generate a neutron beam.

Figure 5:
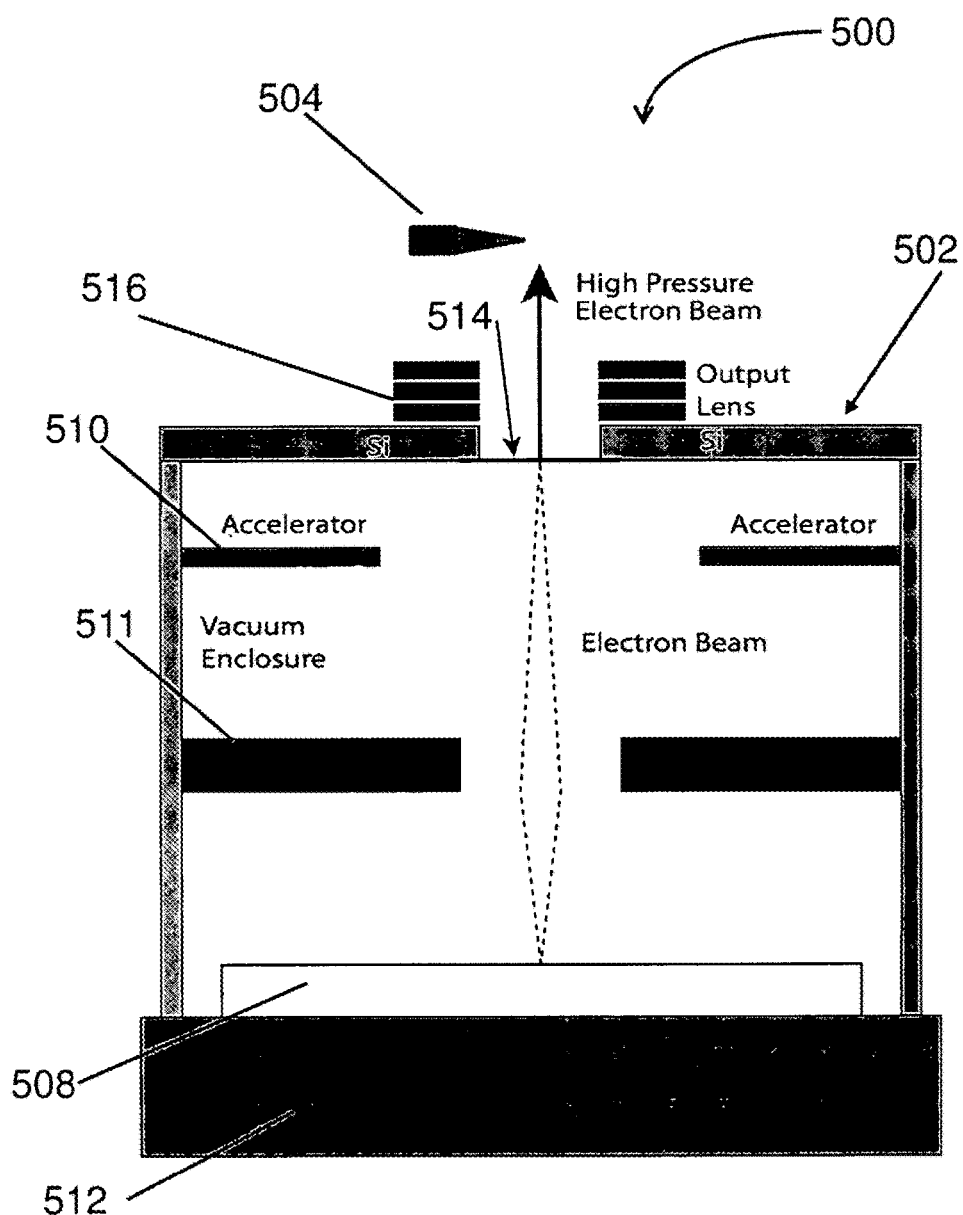
FIG. 5 shows a cross-sectional view of another example compact ion beam source, according the principles herein

FIG. 5 shows a cross-sectional view of another example compact ion beam source 500 according the principles taught herein. The example compact ion beam source 500 includes an electron beam unit 502 and a chemical species source 504. The example electron beam unit 502 includes a modular housing unit 506 that is selectively impermeable to gasses (including oxidizing gaseous molecules), an electron beam source 508 disposed in the modular housing unit, and at least one accelerator component 510 disposed in the modular housing unit 506. The modular housing unit 506 includes a base portion 512 and a window 514 that is selectively transmissive to electrons. The compact ion beam source may include at least one focusing lens 511 to focus the electron beam and at least one anode component 510 to accelerate the electron beam in a path directed at the window 514 of the modular housing unit 506. The chemical species source 504 is disposed proximate to the window of the electron beam unit, and provides at least one chemical species that is ionizable to produce an ion beam on exposure to the electron beam. As shown in FIG. 5, the compact ion beam source also can include at least one output lens 516 positioned outside the modular housing unit 506 proximate to the window 514. The electron beam source 508 of FIG. 5 includes at least one field emitter element having a first end disposed over the base portion 512 and a field emitter tip at a second end. At least one gate electrode is disposed to apply a potential difference proximate to the field emitter tip, thereby extracting electrons from the at least one field emitter tip (via electron tunneling) to form the electron beam ($e^-$) emitted from the electron beam source 508.

In an example, the at least one focusing lens 511 can be formed as Einzel lens, which includes three or more sets of cylindrical or rectangular lenses in series.

In any example implementation, including in connection with the example of any of FIG. 1, 3A, 3B, or 5, the at least one chemical species can be a gas, a liquid or solid particulate matter. In an example, a chemical species that is ordinarily in solid particulate form or liquid form can be introduced by the chemical species source in the form of an aerosol carried by a propellant gas.

In any example implementation, including in connection with the example of any of FIG. 1, 3A, 3B, or 5, the chemical species source can be a hose, syringe, a nozzle, or other apparatus that can be used to introduce the gas, aerosol, or other form of the chemical species to the desired location.

In any example implementation, including in connection with the example of any of FIG. 1, 3A, 3B, or 5, the at least one chemical species can include deuterium, tritium, or other neutron-rich isotope.

In an example implementation, including in connection with the example of any of FIG. 1, 3A, 3B, or 5, the neutron-rich target material can include a triatiated or a deuterated target material.

In an example implementation, including in connection with the example of any of FIG. 1, 3A, 3B, or 5, the voltage applied at the gate electrode structure can be pulsed, resulting in pulse ion generation, and hence pulsed neutron generation.

In any example implementation, including in connection with the example of any of FIG. 1, 3A, 3B or 5, the modular housing unit can be configured to exhibit low permeability to gasses including oxidizing gaseous molecules. Exposure to the oxidizing molecules can reduce the performance of the field emitter element and gate electrodes of the compact ion beam sources. In an example, the modular housing unit can be configured to be impermeable to the oxidizing gaseous molecules.

In any example implementation, including in connection with the example of either of FIG. 1, 3B, or 5, the modular housing unit and the window can be configured to form a hermetic seal of the compact ion beam source. The modular housing unit can include an inert gas. In any example, the modular housing of the compact ion beam source can be maintained at a partial pressure, up to an including being a vacuum, prior to introduction of the chemical species. As non-limiting examples, the pressure in the modular housing unit can range from about 1.0 milliTorr to about $1.0 \times 10^{-9}$ Torr. In an example, the region of the compact ion source with the field emitters can be maintained at a high or ultra-high vacuum (such as but not limited to ranging from about $1.0 \times 10^{-7}$ Torr to about $1.0 \times 10^{-9}$ Torr), while the region in which the ionization occurs can be maintained at a higher pressure (such as but not limited to about 1.0 mTorr).

In any example implementation, including in connection with the example of either of FIG. 1, 3A, 3B, or 5, the modular housing unit can include a plurality of sections that allow passage of multiple, differing beams (whether an electron beam or an ion beam), or differing beams in differing regions. One or more of the plurality of sections can be formed with a window that is transmissive of the desired beam (whether an electron beam or an ion beam).

In any example implementation, including in connection with the example of any of FIG. 1, 3A, 3B, or 5, the window can be a membrane formed from a single layer, or multiple layers, of a two-dimensional material. As non-limiting examples, the window can be formed from graphene, molybdenum disulphide, a nitride material, an oxide material, silicene, or any combination thereof. In an example, the membrane window can be formed from any two-dimensional allotrope of carbon, such as but not limited to graphene. In another example, the membrane window can be formed from any two-dimensional allotrope of silicon, such as but not limited to silicene.

In any example implementation, including in connection with the example of any of FIG. 1, 3A, 3B, or 5, the window can be formed as a thin film layer of a material that is an insulating dielectric in bulk form. The insulating dielectric material can include an oxide, a nitride, or any other dielectric form of aluminum, silicon, germanium, gallium, indium, tin, antimony, tellurium, bismuth, titanium, vanadium, chromium, manganese, cobalt, nickel, copper, zinc, zirconium, niobium, molybdenum, palladium, cadmium, hafnium, tantalum, or tungsten, or any combination thereof.

In any example implementation, including in connection with the example of any of FIG. 1, 3A, 3B, or 5, the base portion can include at least one logic chip, with at least one field emitter element being in electrical communication with the at least one logic chip. The at least one logic chip includes at least one processing unit. The logic chip can be programmed to cause the spatial and/or temporal control of ion beam emissions, as described herein.

In any example implementation, including in connection with the example of any of FIG. 1, 3A, 3B, or 5, the field emitter elements can be formed as one-dimensional arrays, two-dimensional arrays, or staggered three-dimensional arrays. Each array includes a number of field emitter elements disposed over a substrate. The field emitter elements each have a longitudinal symmetry, with a high aspect ratio of height to lateral dimension as described in greater detail below. As a non-limiting example, the field emitter elements can be fabricated in an array at a pitch of about 45 microns or less, about 40 microns or less, about 30 microns or less, about 20 microns or less, about 15 microns or less, about 10 microns or less, about 5 microns or less, about 2 microns or less, or about 1 micron or less. Each field emitter element includes a field emitter tip to emit electrons as described in greater detail below.

A staggered three-dimensional array according to the systems, apparatus and methods herein can be configured as multiple two-dimensional arrays that are dynamically mounted, such that one or more of the two-dimensional arrays may be displaced, and thereby staggered, relative to the other two-dimensional arrays in the direction of the electron emission.

An electron beam unit according to the principles described herein includes a plurality of field emitter elements disposed in at least one field emitter array. Each field emitter element can be a gated vertical transistor, or an ungated vertical transistor, or a current controlled channel that is proximate to an optically-modulated current source.

Figure 6:
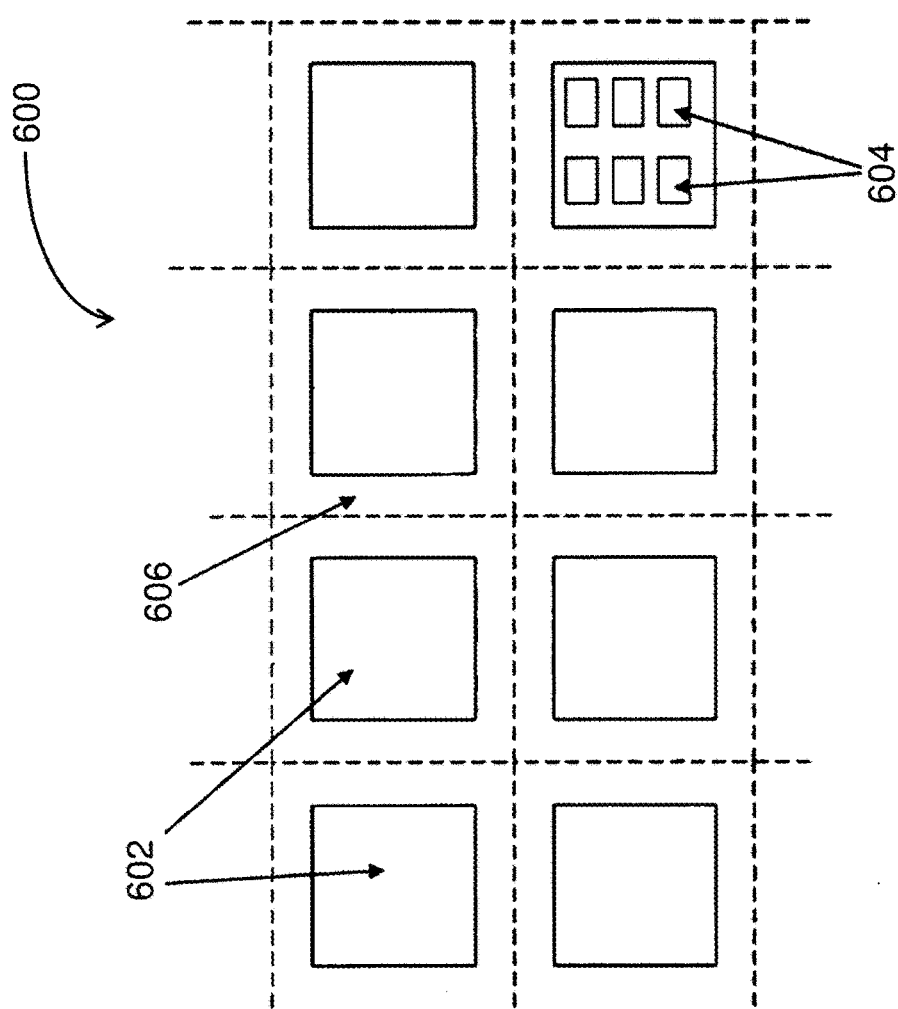
FIG. 6 shows a top view of example field emitter array regions, according the principles herein.

FIG. 6 shows a top view of one or more field emitter array regions disposed over the base portion of a modular housing unit of a non-limiting example electron beam source 600. The example electron beam source 600 can be configured as a compact ion beam source described in connection with any of FIG. 1, 3A, 3B, or 5. Each array region 602 including an array of field emitter elements. Each field emitter element of an example field emitter array can be formed as described in connection with any of the examples described herein. FIG. 6 shows a non-limiting example of an arrangement of a plurality of field emitter arrays 604 that are included in a field emitter array region. The system may also include regions 606 that do not include field emitter elements.

An example compact ion beam source according to the principles described herein is configured with control and logic capabilities. One or more logic chips and/or other control components can be disposed in a portion of the modular housing unit, such as but not limited to in the base portion. In an example, the field emitter array can be controlled using a logical shift register of the logic chip. The shift register facilitates a pattern of "ON" and "OFF" regions to be stored on the logic chip.

The electron beam apparatus can be configured to allow selective activation of one or more of the field emitter elements, such as but not limited to, based on processor-executable instructions executed at a logic chip or other control component located in or coupled to the modular housing unit (including in the base portion).

In an example, to make contact between the logic chip and the electron beam source, 3-D integration techniques such as through-silicon vias (TSVs) or micro-bump bonds, can be used to transfer the signals between the logic chips. The control and logic can be implemented using any of the control logic chips described in connection with any of the examples herein.

In any example herein, each field emitter element can be configured as a high aspect-ratio structure having a first end and a second end. The first end of the field emitter element is disposed proximate to a base. In an example, each field emitter element can include a current channel region disposed proximate to the first end, and a donor-doped region or an acceptor-doped region disposed proximate to the second end, thereby providing a field emitter element that acts as an ungated vertical transistor. In another example, each field emitter element can include a current channel region disposed proximate to the first end, a donor-doped region or an acceptor-doped region disposed proximate to the second end, and a conductive material disposed at a portion of the field emitter element, with an insulator between the current channel and the conductive material (to act as a transistor gate electrode), thereby providing a field emitter element that acts as a gated vertical transistor.

In an example where a donor-doped region is disposed proximate to the second end, the region donor-doped region acts as an accumulation layer. In an example where an acceptor-doped region is disposed proximate to the second end, the region acceptor-doped region acts as an inversion layer. In any example herein, the donor-doped region or acceptor-doped region can be lightly doped or highly-doped.

In an example, the donor-doped region or acceptor-doped region of the current source (including a field emitter element) can be formed from a semiconductor material that is doped with n-type dopants or p-type dopants such that its conductivity varies from more insulating (e.g., about $10^7/cm^3$ carrier density or less) to more conductive (e.g., about $10^{16}/cm^3$ carrier density or more), including values of carrier density within the range from about $10^7/cm^3$ to about $10^{16}/cm^3$. In an example, the donor-doped region can be formed from a Group III-IV semiconductor, such as but not limited to aluminum phosphide, aluminum arsenide, gallium arsenide, or gallium nitride, doped with selenium, tellurium, silicon, or germanium. As a non-limiting example, the donor-doped semiconductor material can be n-type doped GaAs (e.g., GaAs doped with Si). In an example, the acceptor-doped region can be formed from a Group III-IV semiconductor doped with, e.g., silicon, germanium, beryllium, or cadmium. In another example, the donor-doped region can be formed from silicon or germanium doped with phosphorus, arsenic, antimony, or bismuth. In another example, the acceptor-doped region can be formed from silicon or germanium doped with boron, aluminum, or gallium.

In any example implementation, including in connection with the example of any of FIG. 1, 3A, 3B, 5 or 6, the gate electrode layer can include at least two layers, including a dielectric layer disposed proximate to the field emitter elements and a conductive layer disposed over the dielectric layer. The conductive layer can be formed from, as non-limiting examples, a conductive metal, a conductive metal oxide, or a doped semiconductor material. For example, the conductive layer can be based on gold, platinum copper, tantalum, tin, tungsten, titanium, tungsten, cobalt, chromium, silver, nickel or aluminum, or a binary or ternary system of any of these conductive materials. In another example, the conductive layer can be based on a doped semiconductor material, such as but not limited to doped forms of amorphous silicon, poly-crystalline silicon, germanium, a carbon-based conductor, a III-V semiconductor system, or other semiconductor alloy system, or any combination of these doped semiconductor materials. Non-limiting examples of III-V semiconductor systems or semiconductor alloy systems include but are not limited to GaAs, InP, InAs, InSb, InGaAs, AlGaAs, InGaP, AlInAs, GaAsSb, AlGaP, CdZnTe, AlGaN, or any combination thereof. For example, the conductive layer can be formed from a heavily n-doped poly-crystalline silicon.

In any example implementation, including in connection with the example of any of FIG. 1, 3A, 3B, 5 or 6, the at least one field emitter elements can be configured as an array of individually addressable electron sources, to generate individual focused or collimated electron beamlets. As non-limiting examples, the array can be formed as a one-dimensional array or a two-dimensional array. For example, a two-dimensional array can include greater than about $1 \times 10^6$ individually-addressable electron sources, such as but not limited to array densities of $1 \times 10^8$ electron sources (corresponding to 1 µm tip-to-tip spacing).

The field emitter tips of the field emitter elements can be fabricated to have a tip radius of less than about 10 nm. In various examples, the example field emitter tips can be fabricated to have a tip radius of about 1 nm or less, about 2 nm, about 3 nm, about 4 nm, about 5 nm, about 8 nm, about 10 nm, about 12 nm, about 15 nm or more. Each field emitter element can be configured as having a substantially cylindrical geometry having a substantially circular cross-section (in a pillar structure). In other examples, the field emitter elements can be fabricated in arrays of longitudinal structures having differing geometries, including structures having substantially rectangular, triangular, oval or other polygonal cross-section, or structures having lateral dimension that taper or otherwise vary, including tapering from base to tip (such as pyramid-shape structures).

In any example implementation, including in connection with the example of any of FIG. 1, 3A, 3B, 5 or 6, the 1-D or 2-D arrays described herein could be configured for time-multiplexed, matrix-addressed and row-scanned operation of the field emitter elements.

In any example implementation, including in connection with the example of any of FIG. 1, 3A, 3B, 5 or 6, the field emitter elements can be configured as arrays of individually addressable and temporally controllable electron sources such that the individual electron beamlets can be separately turned ON and OFF, at times on the order of nanoseconds to microseconds. The field emitter elements also can be configured to generate differing strengths of individual the electron beamlets across the arrays. This allows spatial and temporal control of the emission of individual electron beamlets across the area of the field emitter array, and as a result control of the ion beamlets generated as a result of the ionization process. In an example where separate the modular electron beam units are formed with multiple differing windows, the field emitter elements also can be configured for separately addressable control, such that the electron beamlets from the various windows, and the ion beams generated from the ionization, can be separately turned ON and OFF, both temporally and spatially, across the arrangement of membrane windows.

In any example implementation, including in connection with the example of any of FIG. 1, 3A, 3B, 5 or 6, the compact ion beam sources can be configured for individually addressable and temporally controllable application of a positive potential difference between the gate electrode and individual or groups of the emitter tips of the field emitter arrays. This allows separately turning ON and OFF of ion beamlets generated through a field ionization mechanism, at times on the order of nanoseconds to microseconds. This provides spatially and/or temporally controlled individual ion beamlet sources across the area of the field emitter array. In an example where separate the modular electron beam units are formed with multiple differing windows, the field emitter elements also can be configured for separately addressable control, such that the ion beamlets generated from the ionization from the various windows can be separately turned ON and OFF, both temporally and spatially, across the arrangement of membrane windows.

In a non-limiting example, the field emitter elements can be made out of silicon, germanium, carbon, a Group III-V semiconductor system, or other semiconductor alloy system, or any combination of these semiconductor materials, or other conductive materials, as the current sources. In any of the examples described herein, the conductive material can be but is not limited to a transition metal (including a refractory metal), a noble metal, a semiconductor, a semimetal, a metal alloy, or other conductive material. In an example, the metal or metal alloy can include but is not limited to aluminum, or a transition metal, including copper, silver, gold, platinum, zinc, nickel, titanium, chromium, or palladium, tungsten, molybdenum, or any combination thereof, and any applicable metal alloy, including alloys with carbon. In an example, the field emitter element can be a refractory metal. In an example, the conductive material can be a conductive polymer or a metamaterial. In other non-limiting example, suitable conductive materials may include a semiconductor-based conductive material, including other silicon-based conductive material, indium-tin-oxide or other transparent conductive oxide, or a Group III-V conductor (including GaAs, InP, and GaN). Other non-limiting examples of III-V semiconductor systems or semiconductor alloy systems include but are not limited to InAs, InSb, InGaAs, AlGaAs, InGaP, AlInAs, GaAsSb, AlGaP, CdZnTe, AlGaN, or any combination thereof. The semiconductor-based conductive material can be doped. The field emitter array can be formed from an array of high aspect-ratio nanoscale systems formed from conductive or semiconductor materials, including nanoparticles, nanoshells and/or nanowires. As another example, field emitter array can be formed from an array of high aspect-ratio nanoscale systems of carbon, including single-walled and multi-walled carbon nanotubes, nanofibers, nanohorns, nanoscale heterojunction structures, graphene-based nanostructures, and carbon nanoribbons (including graphene nanoribbons and graphitic nanoribbons). In other examples, the field emitter element can include diamond, or other conductive carbon-based material. In any of the examples herein, the field emitter element can be formed from an electrically non-conductive material that includes a coating or other layer of an electrically conductive material, such as but not limited to a thin coating of a noble or refractory metal on the emitter tip.

In an example aspect, the field emitter tip can be formed from a portion of the field emitter element and/or can be formed from coating or otherwise layering a portion of the field emitter element with a conductive material (including any conductive material described herein).

As a non-limiting example, the field emitter arrays described herein can be fabricated to have a high aspect ratio of height to lateral dimension, such as but not limited to, aspect ratios of height to lateral dimension ranging from about 5:1 or more, about 10:1 or more, about 50:1 or more, about 100:1 or more, about 200:1 or more, about 500:1 or more, about 800:1 or more, about 1000:1 or more, or about 5,000:1 or more. In an example, the field emitter elements can have a height of around 10 microns. In other examples, the array can include longitudinal structures of differing heights, such as but not limited to about 0.5 microns, about 1 micron, about 5 microns, about 15 microns, about 20 microns or about 30 microns or more.

As a non-limiting example, the field emitter arrays described herein can be fabricated to provide current limiters in series, for uniformity and reliability. For example, the field emitter elements can be formed as a plurality of silicon pillar current limiters in series, which can facilitate greater uniformity and reliability.

An example compact ion beam source herein can also include a set of electrostatic electrodes. The electrostatic electrodes could be integrated with each field emitter element for the purpose of shaping, and accelerating the electron beamlets (i.e., the electron beam from an individual or small number of field emitter element). These electrostatic electrodes can include at least one additional extraction gates and/or one or more focusing lenses, to form collimated and/or focused electron beamlets. As a non-limiting example, microfabricated Einzel lenses could be integrated with individual field emitters, or groupings of two more field emitters, to form collimated or focused beam lets. The example compact ion beam source can also include additional microfabricated electron optical elements, such as but not limited to at least one acceleration grid and/or at least one stigmation corrector. The example compact ion beam source can include types of electron optics to form a nano-electron optical column. In various examples, the electron optics can be electrostatic electron optics or magnetic electron optics. An example compact ion beam source herein can be configured to act on each individual beamlets or on groups of beamlets. In the various examples herein, a beamlet could be generated by an individual field emitter, or a beamlet could be generated by a grouping of two more field emitters.

An example compact ion beam source herein can include arrays of field emitter elements that can be regulated to switch the emission current. In an example, the emission current can be regulated by placing a current limiter (also referred to herein as a current channel region) in series with the field emitter element to controls the supply of electrons to the tunneling barrier. In an example, by modulating the emission current of individual field emitter elements, the currents of all of the electron beams in an array can be equalized despite field emitter tip radii variations, resulting in more uniform emissions. The current limiter can prevent premature emitter burn-out by the sharper emitter tips, and could also prevent premature burn-out of very sharp field ionizers (e.g., field emitters working in the field ionization mode). The current limiter can also prevent arcing and the formation of a microplasma.

For any example compact ion beam source herein, the regulated current limiters can be implemented to allow for the control of the emission current of individual field emitters. In a first example, a logic control element (such as but not limited to a CMOS logic control chip) can be coupled to a gate electrode of a vertical transistor formed from a field emitter element, to switch the transistor current source on and off, thereby providing a field emitter element that is a controlled current source.

An example compact ion beam source described herein can be used for a variety of applications, such as but not limited to, for food processing and preservation, environmental sample analysis (e.g., environmental SEM), compact neutron generators/sources, mass spectrometers, reactive ion etchers (without need for generating a plasma), air filtration, particulate matter detection, biological agent detection, and chemical agent detection.

An example compact ion beam source described herein can be used as a portable neutron source that can be utilized for in-field radiography or sensing. An example portable neutron source can, for example, be used for fast identification of the presence of explosives, drugs, pharmaceuticals, or other chemical materials or agents.

An example compact ion beam source according to the principles herein, including a compact ion beam source as described in connection with the example of any of FIG. 1, 3A, 3B, 5 or 6, can be formed as a compact deuterium ion beam source.

A compact deuterium ion source ($D^+$) with a beam current of 0.5 mA with a volume of less than about 2 L, that weighs less than about 10 lbs, and that consumes less than about 200 W of power could be used in a portable neutron source that is about the size of a toolbox with an effective spot size of about 2 mm (full width at half max (FWHM)). The compact deuterium ion source also could be configured for hermetically-sealed operation. A compact neutron source could be formed using a compact deuterium ion source and a neutron-rich target material, as described hereinabove. Such a neutron source could have a volume of less than about 8 L, weigh less than about 30 lbs, and consume less that about 400 W. The neutron source can function using a triatated target through a D-T reaction, as follows:

$$_1^2D + _1^3T \rightarrow _2^4He + _1^0n$$

or using a deuterated target through the D-D reaction, as follows:

$$_1^2D + _1^2D \rightarrow _1^3T + _1^0n$$

The neutron source could have an operating lifetime of greater than about 1000 hours. This could be an advancement over current state of the art neutron sources, which often weigh more than 300 lbs., have a large footprint with a volume greater than about 100 L, and consume tens of kilowatts of power (requiring a three-phase power source). Such existing neutron sources are far from being toolbox size or considered portable. The lack of portable sources can be beneficial for portable nuclear radiography and sensing. The availability of a portable neutron source also can enable concepts of operation that are currently not feasible due to size, weight and power (SWaP) constraints.

The example compact ion beam source can be formed as a deuterium ion source ($D^+$) with an output current of about 500 μA in a compact format with a volume less than 2,000 $cm^3$, weighing less than 10 pounds and consuming less than 200 W. The compact deuterium ion source provides the ability to extract a $D^+$ beam without the need for external focusing elements and match the beam to the accelerator column. The example compact deuterium ion source ($D^+$) can be integrated into a −150 kV accelerator to produce neutrons from a tapered triatiated target, with an effective full width half maximum (FWHM) spot size of 2 mm when viewed on axis of the accelerator. The example deuterium ion source functions based on ionization of deuterium gas using arrays of high aspect ratio MEMS structures with small radii at the tip, which are operated in the either electron impact ionization (EII) mode or the field ionization (FI) mode. The MEMS ionizer include self-aligned gated field emitter arrays, where each emitter is individually regulated with a current source in order to increase the resistance to thermal runaway and improve reliability. Each field emitter array also has an integrated focus electrode. The integrated focus electrode focuses electrons into the ionization region preventing divergence of the electron beam, and prevents ions from streaming back from the ionization region to damage the field emitter tip. The integrated focus electrode also collimates ions for a compact ion beam source operated in the FI mode.

Figure 7B:
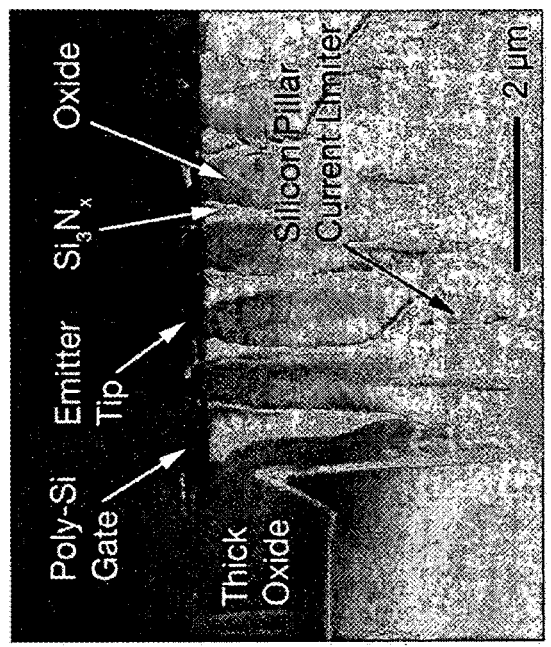
FIG. 7B shows a cross-section of a fabricated single gate field-emission source, according the principles herein.
Figure 7A:
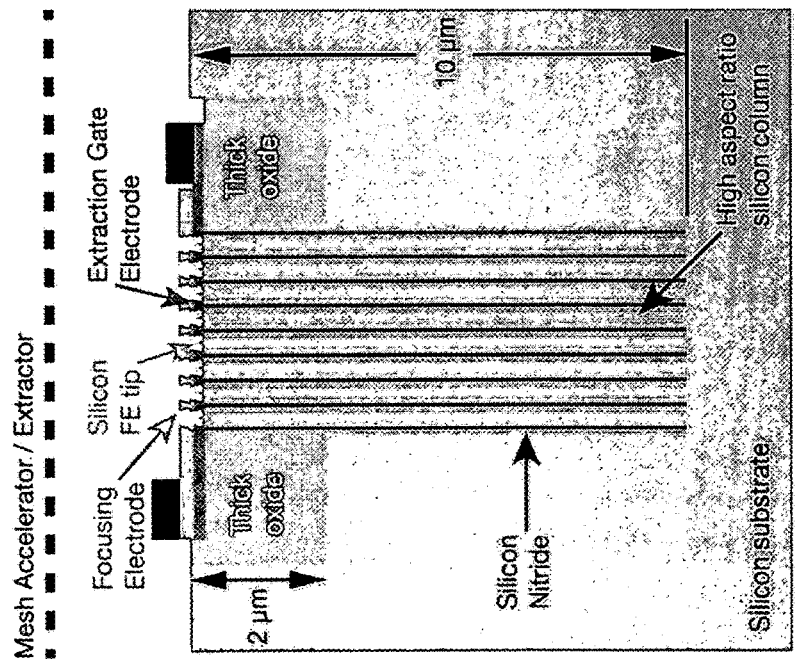
FIG. 7A shows a schematic cross-sectional view of an example electron beam source, according the principles herein

FIG. 7A shows a schematic cross-sectional view of an example electron beam source including an array of field emitter elements. The example electron beam source includes high aspect ratio silicon field emitter elements surrounded by an insulating dielectric of silicon nitride over a silicon substrate base. The field emitter elements include silicon field emitter tips. Extraction gate electrodes and focusing electrodes are disposed proximate to the field emitter tips. Extraction gate electrodes and focusing electrodes are disposed over a thick dielectric stack of an insulating oxide. The thick insulator (2 μm-4 μm) stacks are used to separate the gate electrode from the substrate of the field emitter tips. A mesh accelerator/extractor is used to accelerate the emitted beam, which can be an electron beam or an ion beam depending on the mode of operation.

FIG. 7B shows a cross-section of a fabricated single gate field-emission source (also referred to herein as a MEMs Gas Ionizer), that includes a plurality of high aspect ratio gated field emitter elements with small tip radii (also referred to herein as MEMS structures). Based on the small tip radius, high tip electric fields can be obtained at low applied voltages. The gate is formed from poly-silicon and the field emitter pitch is about 1 μm.

The compact ion beam sources including the MEMS field emitter structures of FIGS. 7A and 7B can be used to ionize the isotope, deuterium ($D_2$) molecules in this example. The arrays of MEMS self-aligned gate field emitter structures can be operated in either of two modes. The first mode is the electron impact ionization (EII) mode in which the cold electrons emitted from the field emitter tip surface are accelerated to a potential difference ranging from about 200 V to about 1000 V to form an electron beam. The applied potential difference can be of any value applied between the gate electrode and the field emitter tip that is sufficient to allow electron tunneling. The second mode is the field ionization (FI) mode.

Figure 8:
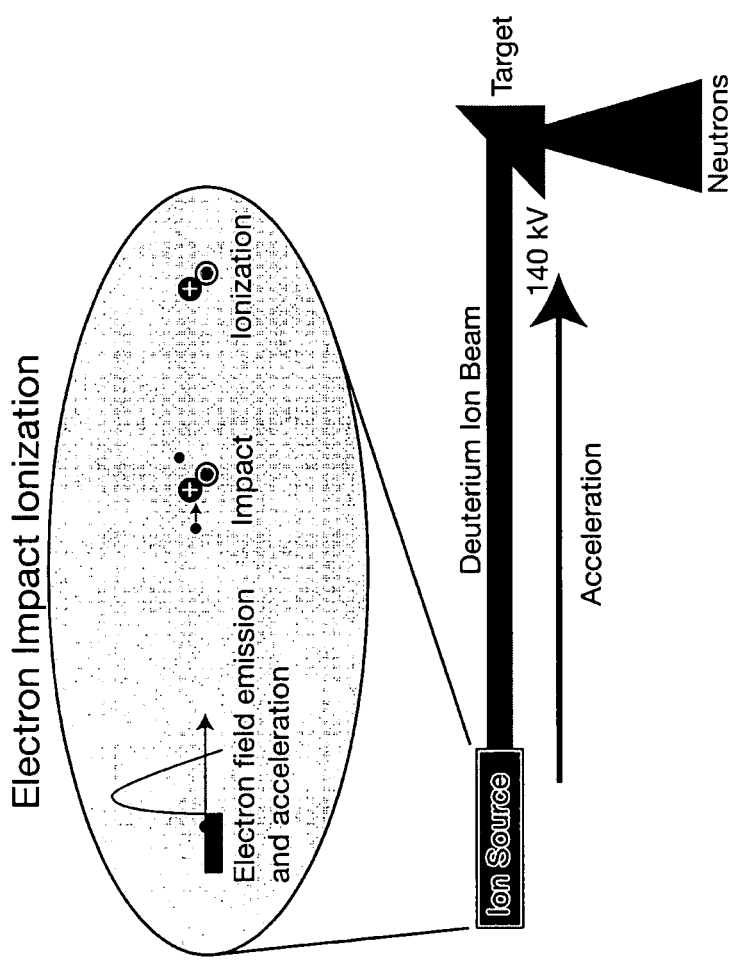
FIG. 8 shows an example of a neutron source based on a deuterium ion beam source, according the principles herein.

FIG. 8 shows an example of a neutron source based on a deuterium ion beam source operating on the principles of electron impact ionization. Electrons are emitted from the conical tip surface when the tip surface barrier is deformed by an electric field through the application of a positive voltage between the self-aligned gate electrode and the field emitter tip. The small emitter tip radius results in very high electrostatic fields near the emitter tip surface resulting in electron tunneling. Emitted electrons are accelerated to the ionization chamber/region of the modular housing unit, where they collide with and ionize deuterium (neutral $D_2$ molecules). The collision leads to ionization and dissociation of the $D_2$ molecule. The isotope ions are then extracted into to an acceleration region for the neutron source where they follow a trajectory to a neutron-rich target. This can be a triatiated or deuterated target.

Figure 9:
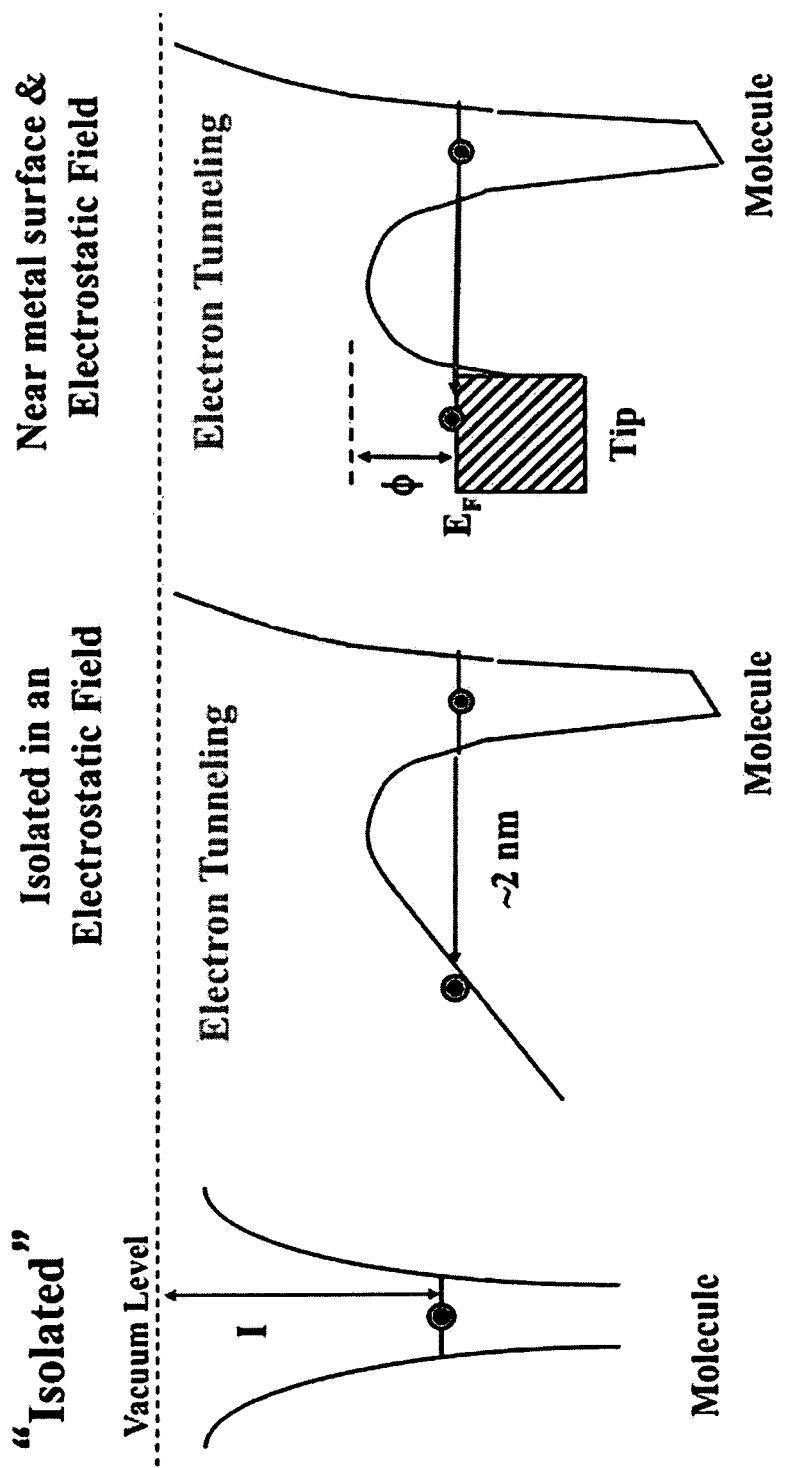
FIG. 9 shows an example of a neutron source based on a deuterium ion beam source, according the principles herein.

FIG. 9 shows an example of a neutron source based on a deuterium ion beam source operating on the principles of field ionization. Molecules of the isotope ($D_2$) are introduced at the tip of the MEMS field emitting elements. The field emitter tips are biased at a positive potential with respect to the gate electrode, such that the isotope molecules encounter very high electrostatic field that severely deforms the molecules. Electrons tunnel from the isotope molecule to the field emitting tips, resulting in the isotope ions ($D^+$ ions). The beam of $D^+$ ions are ejected from the emitter tip region and follow a trajectory towards a collector that is biased at the lowest potential. For example, the mesh accelerator/extractor of FIG. 7A could be used as the collector based on the appropriate potential difference applied.

Figure 10:
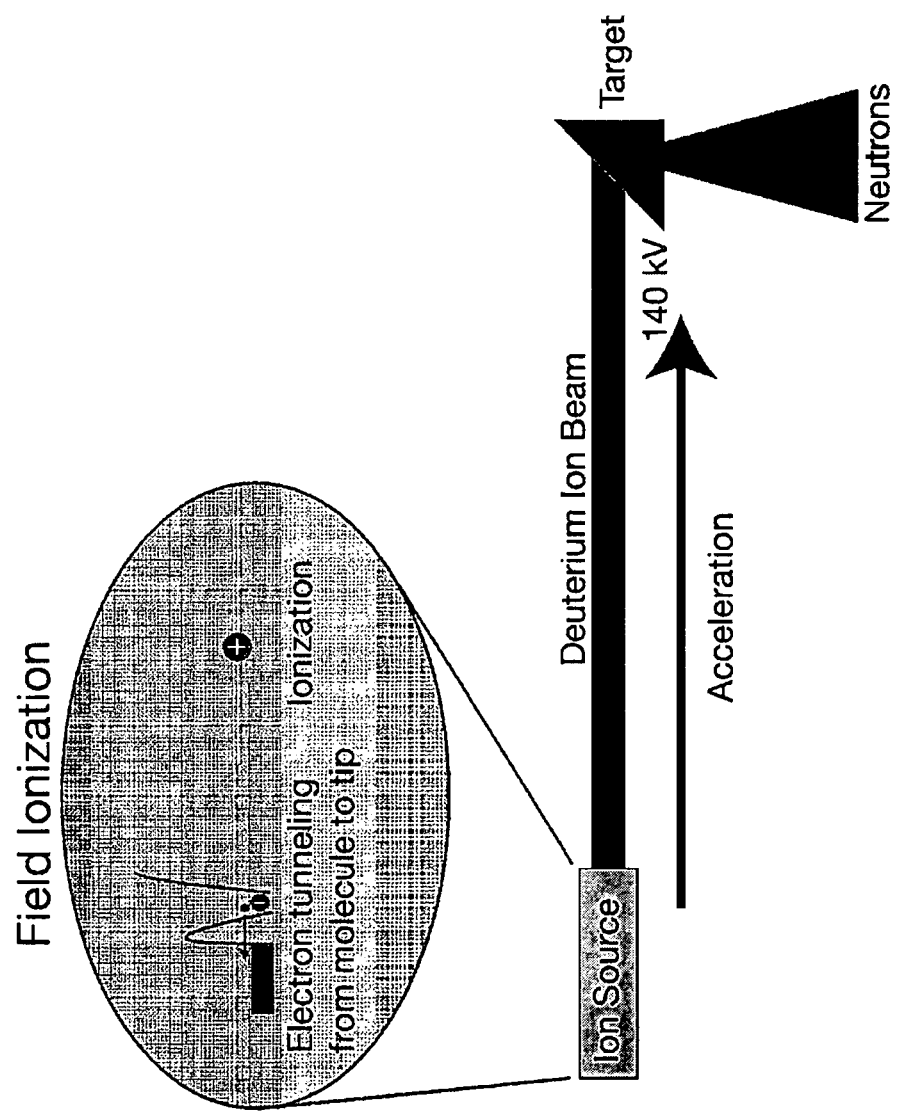
FIG. 10 shows an example of a beam of deuterium ions directed at a target, according the principles herein.

As shown in FIG. 10, the beam of deuterium ions that are extracted by the mesh collector can be accelerated to a neutron-rich target biased at about −150 kV, where neutrons are generated. The neutron-rich target can be a triatiated or deuterated target.

In either the EII or FI mode of operation, the voltage applied at the gate electrode structure can be pulsed, resulting in pulse ion generation, and hence pulsed neutron generation. The pulse mode is expected to have very fast operation (≈1 ns) because of the low capacitance between the gate electrode and the emitter.

Based on results using field emission arrays in electron impact ionizers for mass spectrometry and vacuum pump applications, the ionization efficiency ($I_{Ion}/I_E$) is expressed based on the vacuum pressure and other geometric factors, as follows:

$$\frac{I_{ion}(T)}{I_E(T)} = \rho \times L \times \sigma_{Total}(T) = \frac{P}{kT} \times L \times \sigma_{Total}(T)$$

where $I_{Ion}$ is the ion current, $I_E$ is the electron current ρ is the number density of deuterium, L is the length of the ionization chamber in the current path, $\sigma_{Total}$ is the ionization cross-section, P is the pressure, k is Boltzmann's constant and T is the absolute temperature in Kelvin. Ionization efficiency of 0.16 is demonstrated for argon when the ambient pressure is 20 mTorr using electron impact ionization principles. An ion current of 22.5 μA is generated with an electron current of 140 μA at a pressure of 20 mTorr. A linear dependence of the impact ionization efficiency on the ambient pressure is observed over many decades of pressure ranging from $10^{-7}$ Torr to 100 mTorr. See, e.g., Velasquez Garcia et al. "CNT-Based MEMS/NEMS Gas Ionizers for Portable Mass Spectrometry Applications" Journal of MicroElectroMechanical Systems, Vol. 19, No. 3, June 2010, p. 484. Using these operating parameters, in order to obtain an ion current of 500 μA, it is estimated that an electron current of 3.125 mA should be accelerated into the impact ionization region. Currents of 10 mA CW can be obtained from our Pt coated Si tip gated field emitters which have an area of 0.32 cm² and 320,000 nanoscale emitters. The emitter tip pitch is 10 μm, the gate insulator stack thickness is 2.5 μm and the gate aperture is 3 μm. Changing the tip spacing from 10 μm to 3 μm can result in a reduction of the cathode area by a factor of ten. See, e.g., A A Fomani et al, "Toward Amp-level Field Emission with Large area Arrays of Pt-coated Self-aligned Gated Nano-scale Tips," IEEE Transactions on Electron Devices, Vol. 61, No. 7, July 2014, p. 2538. Provided a plasma is not ignited, it is possible to operate the field emitter in the electron impact ionization (ELI) mode. The pressure may not need to be reduced in order to avoid igniting plasma, and is estimated to be between about 1.0 mTorr-about 5 mTorr. The acceleration column has a voltage drop of about 150 kV. Decreasing the pressure to 2 mTorr can increase the current to generate an ion current of 500 μA. At a pressure of about 2 mTorr, an electron emission current of 31.25 mA can be used to generate an ion current of about 500 μA.

The results show that a compact ion beam source operated in a EII mode using the isotope $D_2$ can provide desirable performance. An estimate for the size, weight and power consumption of the compact ion beam source is provided.

Figure 11:
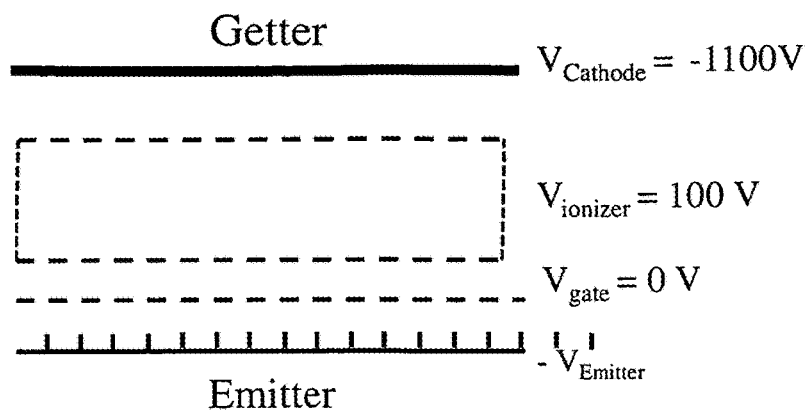
FIG. 11 shows an example ion pump, according the principles herein.
Figure 11:
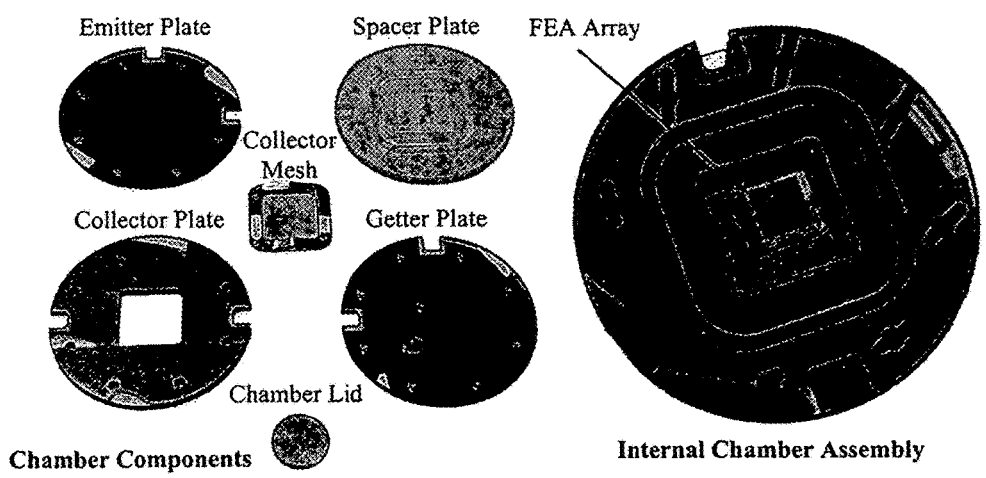

FIG. 11 shows an example ion pump based on electron impact ionization using a field emission array electron source. The volume is about 7 cm×7 cm×1 cm (<50 cm³). The size of an example compact ion beam source herein can be comparable to or smaller than the ion pump shown in FIG. 11. The pump uses field emitted electrons to impact ionize gas molecules and embed the ions into a getter. See, e.g., A. A. Fomani et al, "Challenges of High Vacuum Pumping based on Impact Ionization and Ion Implantation Process," Technical Digest of the 27th International Vacuum Nanoelectronics Conference, July 2014, p. 210. The estimated volume of an example compact ion beam source can be less than about 50 cm³ (7 cm×7 cm×1 cm). The electronics to control an example compact ion beam source also can be compact and lightweight. Assuming the electronics and the battery of an example compact ion beam source can have similar volumes to the pump, then the total volume can be less than about 150 cm$^3$. If a 25 L bottle of deuterium ($D_2$) bottle is included, the volume is 850 cm$^3$. An example compact ion beam source along with its drive electronics and battery could weigh less than about 1.5 lb. With the 25 L bottle of deuterium ($D_2$) bottle included, the weight is less than about 3.5 lbs. Assuming an impact ionization efficiency of 0.01 and anode voltage of 200 V and an electron current of 50 mA to generate an ion current of 500 µA, the resulting power consumption can be about 10 Watts. With the 25 L bottle of deuterium ($D_2$) bottle included, the power consumption is less than about 32 W for the modular unit.

The lifetime of an example compact ion beam source is also estimated. No significant erosion of the field emitter tips is expected as a result of back ion bombardment of the tips by $D^+$, given its low atomic mass. The lifetime can be improved by connecting in series with each field emitter element a current limiter. As shown in FIG. 7B, the current limiter can be based on high aspect ratio silicon columns. In an example, a single-gated field emitter structure can be used to focus the emitted electrons. In another example, a double-gated field emitter structure can be used to focus the emitted electrons, and at the same time attract ions streaming back to the emitter tips from the ionization region. This deflects them from going to the emitter, as also shown in FIG. 7B. The modular housing unit and window in the example compact ion beam source allows separation of the electron emitting and the ionization region. The thin membrane can be made transparent to electrons while being impervious (or at least exhibit low permeability) to gas molecules. In the example compact ion beam source, the region of the compact modular housing with the field emitters can be maintained at ultra-high vacuum (about 10$^{-8}$ Torr), while the ionization region is maintained at about 1 mTorr. This can require an accelerating electrode within the UHV enclosure of the modular housing so that electrons are transmitted through the membrane.

Figure 12:
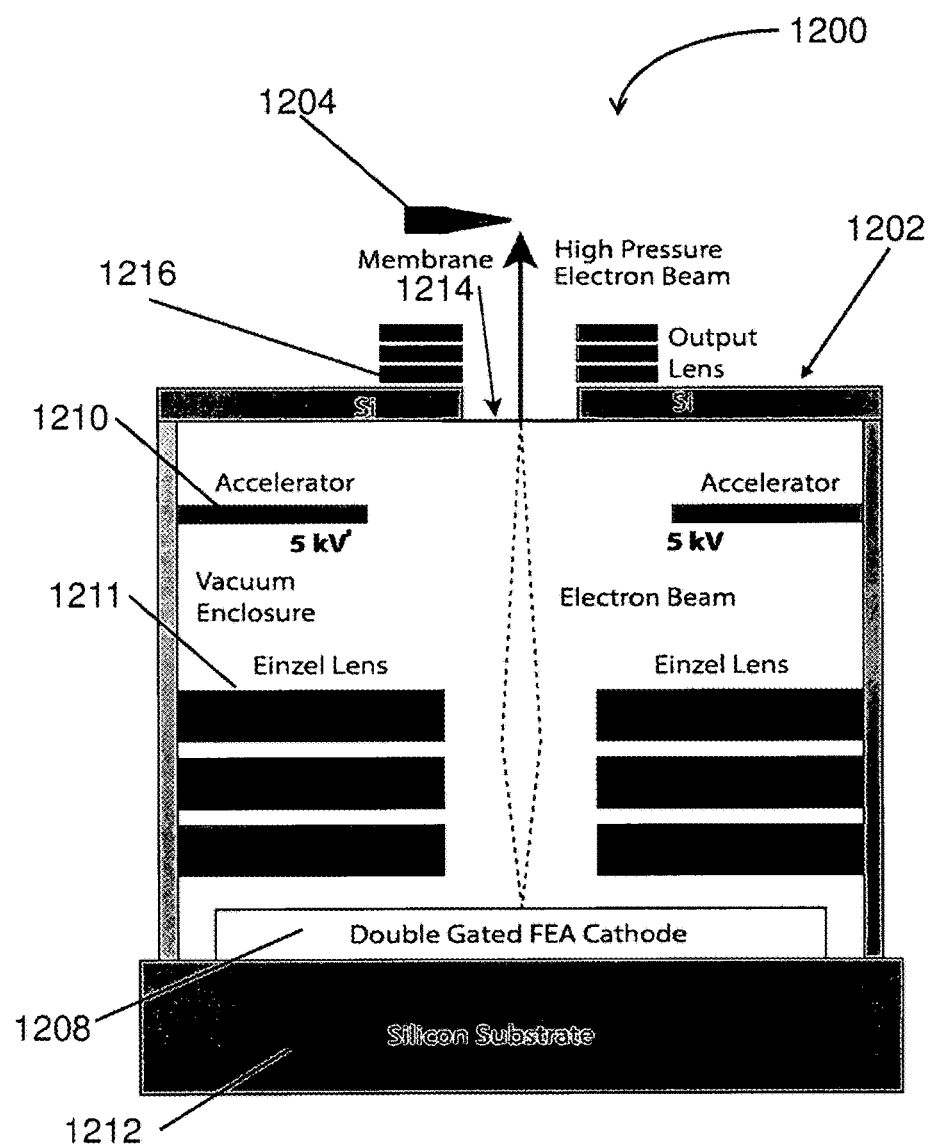
FIG. 12 shows a cross-sectional view of the structure of an example compact ion beam source, according the principles herein.

FIG. 12 shows a cross-sectional view of the structure of an example compact ion beam source 1200. The example compact ion beam source is based on a two-dimensional array of double gated field emitter arrays (FEA). The example compact ion beam source 1200 includes an electron beam unit 1202 and a chemical species source 1204. The example electron beam unit 1202 includes a modular housing unit 1206 that is selectively impermeable to gasses including oxidizing gaseous molecules, an electron beam source 1208 (which can be a single-gated or double-gated FEA) disposed in the modular housing unit, and at least one accelerator component 1210 disposed in the modular housing unit 1206. The modular housing unit 1206 includes a base portion 1212 and a membrane window 1214 that is selectively transmissive to electrons. In this example, the compact ion beam source also includes Einzel lens 1211 to focus the electron beam and an accelerator 1210 to accelerate the electron beam in a path directed at the window 1214 of the modular housing unit 1206. In another example, the Einzel lens can be eliminated. The chemical species source 1204 is disposed proximate to the membrane window 1214, and provides at least one chemical species that is ionizable to produce an ion beam on exposure to the electron beam. As shown in FIG. 12, the compact ion beam source includes output lens 1216 positioned outside the modular housing unit 1206 proximate to the window 1214. The electron beam source 1208 of FIG. 12 includes a plurality of field emitter elements, each having a first end disposed over the base portion 1212 and a field emitter tip at a second end, and the gate electrodes disposed to apply a potential difference relative to the field emitter tips. The single-gated or double-gated field emitter structure can be used to focus the emitted electron beam (e$^-$), and at the same time attract ions streaming back to the emitter tips from the ionization region.

In operation in the field ionization mode, a field ionization current of 10 nA from He at a pressure of 1 Torr can be obtained. Operation of the example device is also demonstrated in an impact ionization mode. In order to obtain a current of 500 µA, a 5×10$^5$ fold increase in ionization current is used. It is observed that fewer than all the field emitter tips, and perhaps only one or a few tips, could contribute to the field ionization current at any bias voltage before saturating at the supply limited current, if there is some non-uniformity of the emitter tip radii. This can affect operation in the field ionization mode, since the current-voltage characteristics for field ionizers has an exponential dependence in the barrier-limited regime which governs the onset of field ionization. The relationship between field ionization current, $I_{ion}$, and the applied gate voltage, $V_G$, can be expressed as:

$$I_{ion} = K(P)\exp\left[-\frac{0.95B}{\beta V_G}(I^{3/2} - \phi^{3/2})\right] = K(P)\exp\left[-\frac{0.95B}{V_G}r_{tip}(I^{3/2} - \phi^{3/2})\right]$$

where K is a pre-factor that depends on the supply of gas molecules and hence pressure (P), B is a field emission constant, I is the ionization potential of the gas molecule, $\phi$ is the work function of the emitter tip, $V_G$ is the applied gate voltage and $\beta$ is the field factor. To the first order the field factor can be expressed as $$\beta \approx \frac{1}{r}.$$

Thus a distribution of r suggests a distribution of $\beta$. This suggests that the onset of field ionization occurs at varying gate voltages and the emitter tips with small tip radius can turn-on at much lower voltages than those that have larger tip radius. See, e.g., A. A. Fomani, et al., "Low-Voltage Field Ionization of Gases Up to Torr-Level Pressures Using Massive Arrays of Self-Aligned Gated Nanoscale Tips," IEEE Transactions on Electron Devices, IEEE Transactions on Electron Devices, Vol. 61, No. 5, May 2014, 9. 1520.

Figure 13:
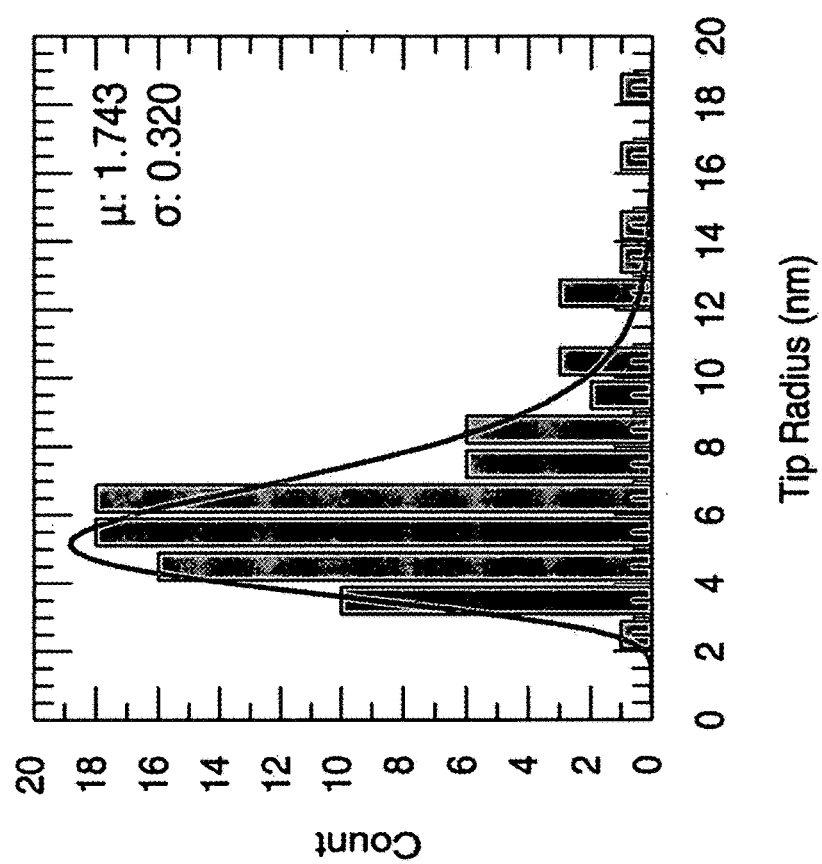
FIG. 13 shows a plot of an example distribution in emitter tip radius for a field ionization array, according the principles herein.

FIG. 13 shows a plot of an example distribution in emitter tip radius for a field ionization array fabricated using silicon etch and oxidation sharpening. A less uniform result can be obtained for metal tips deposited by angle evaporation. The plot shows tip radius statistics measured across the die after field emission testing, exhibiting a log-normal distribution with a mean of 5.71 nm and a standard deviation of 1.38 nm.

Figure 14:
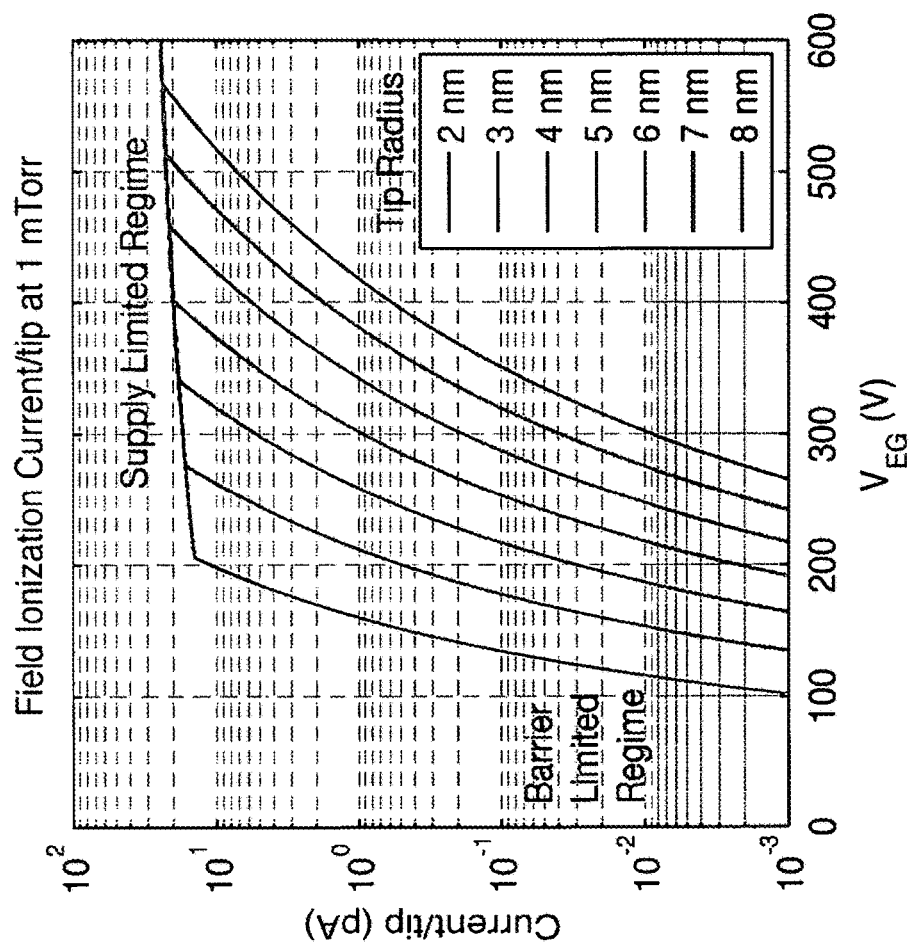
FIG. 14 shows a plot of an example of the effect of emitter tip radius on field ionization, according the principles herein.

FIG. 14 shows a plot of an example of the effect of emitter tip radius on field ionization. The plot shows that fewer than all emitter tips at the leading edge of the log-normal distribution may be able to partake in field ionization, and some of the emitter tips may not. It provides an explanation for why the ionization current from gate field ionization arrays have not scaled with the array size and ionization current per tip is orders of magnitude below current from etched wires. FIG. 14 shows a simulation of the effect of the tip radii distribution on the field ionization turn-on voltage, indicating that small changes in tip radius can result in large changes in field ionization turn-on voltage.

The results show that some tips that have small tip radius can field ionize and the majority of tips cannot ionize gas molecules unless much larger gate voltages are applied and at which point the tips with much smaller radius can be supply limited. To the first order, the dependence of fractional change in the field ionization onset voltage on the fractional change in the tip radius is linear, i.e., $$\frac{\Delta V_{I_{ON}}}{V_{I_{ON}}} \approx \frac{\Delta r}{r}$$

Example compact ion beam sources according to the principles herein can include field emitter arrays with more uniform tip radius distribution, resulting in an increased number of tips that field ionize gas molecules and contribute to the field ionization current. This could be accomplished by making the tip radius bigger but with reduced variation. In the example compact ion beam sources herein, premature dielectric breakdown is mitigated by using novel and thick dielectric stacks and use emitters based on tip-on-a high aspect ratio column architecture. The field emitter arrays can include field emitter elements having aspect ratio of 100:1 and that are spaced 1 μm apart and have very small gate apertures with diameter less than about 0.4 μm. The structure typically has tip radius between about 5 nm and about 10 nm, allowing high field to be formed on the emitter tip surface, and tunneling of electrons when a voltage is applied between the self-aligned proximate gate electrode and the tip.

Figure 15:
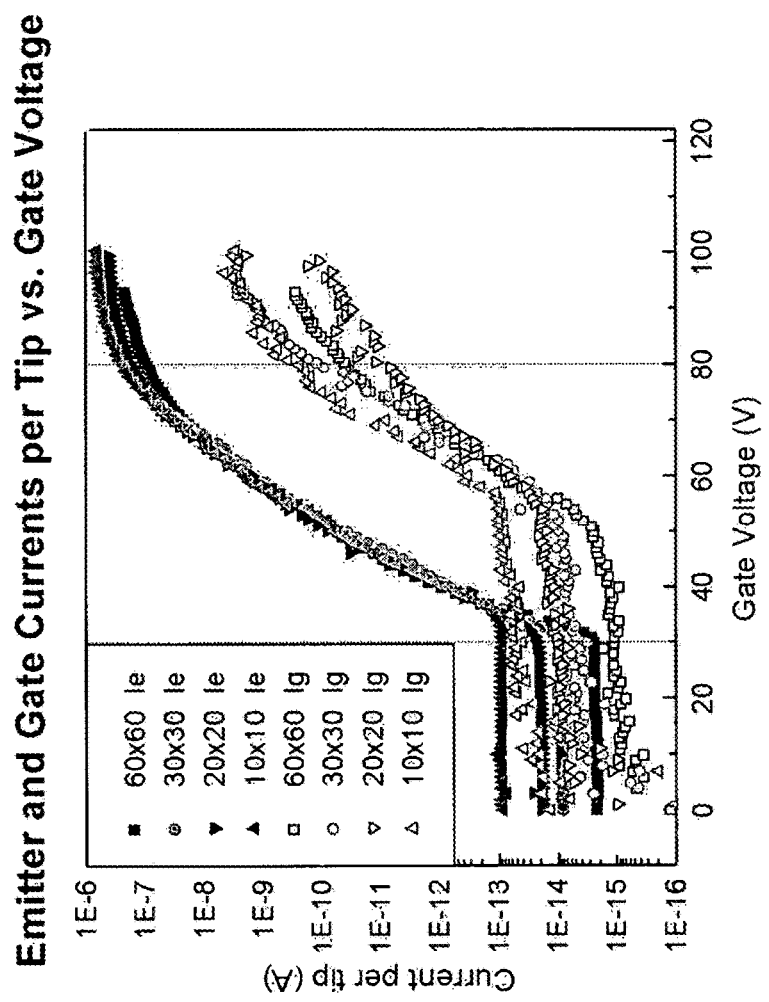
FIG. 15 shows a plot of example emitter and gate currents per tip as functions of gate voltage, according the principles herein.

FIG. 15 shows a plot of an example emitter and gate currents per tip as functions of gate voltage for four different sized 4 μm pitch field emitter arrays (FEAs) within a single die. The example compact ion beam sources herein include field emitter arrays with increased the tip radii (to about 10 nm). The current/tip scale with array size. The example field emitter arrays are fabricated using lithography approaches that have better contrast such tri-level resist. It is demonstrated that the current per tip for arrays of 10×10, 20×20, 30×30 and 60×60 all had the same current/tip voltage characteristics and the currents all saturated to the same value, as shown in FIG. 15. Uniformity was obtained through a combination of mask layout, resist processing, silicon etching and oxidation. If similar tip radius uniformity could be obtained, it is expected that field ionization current would also scale with the number of tips. These results show that it is possible to obtain uniform tips and emission.

Figure 16:
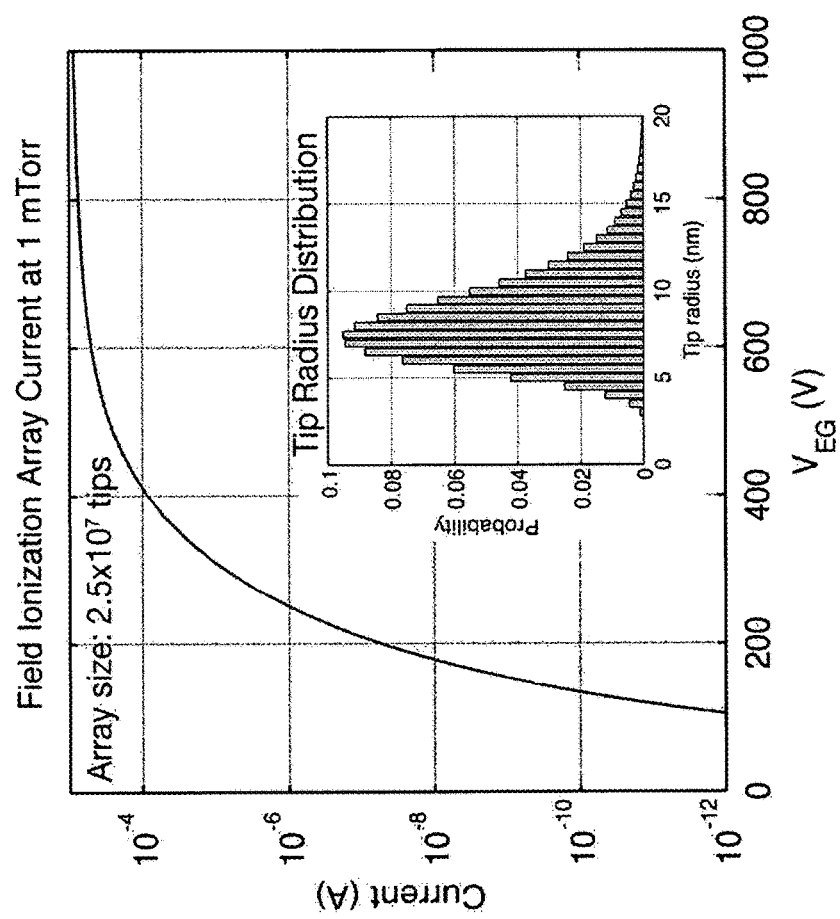
FIG. 16 shows the results of a simulation of the current-voltage characteristics of a 320,000 tip field ionizer array, according the principles herein.
Figure 17:
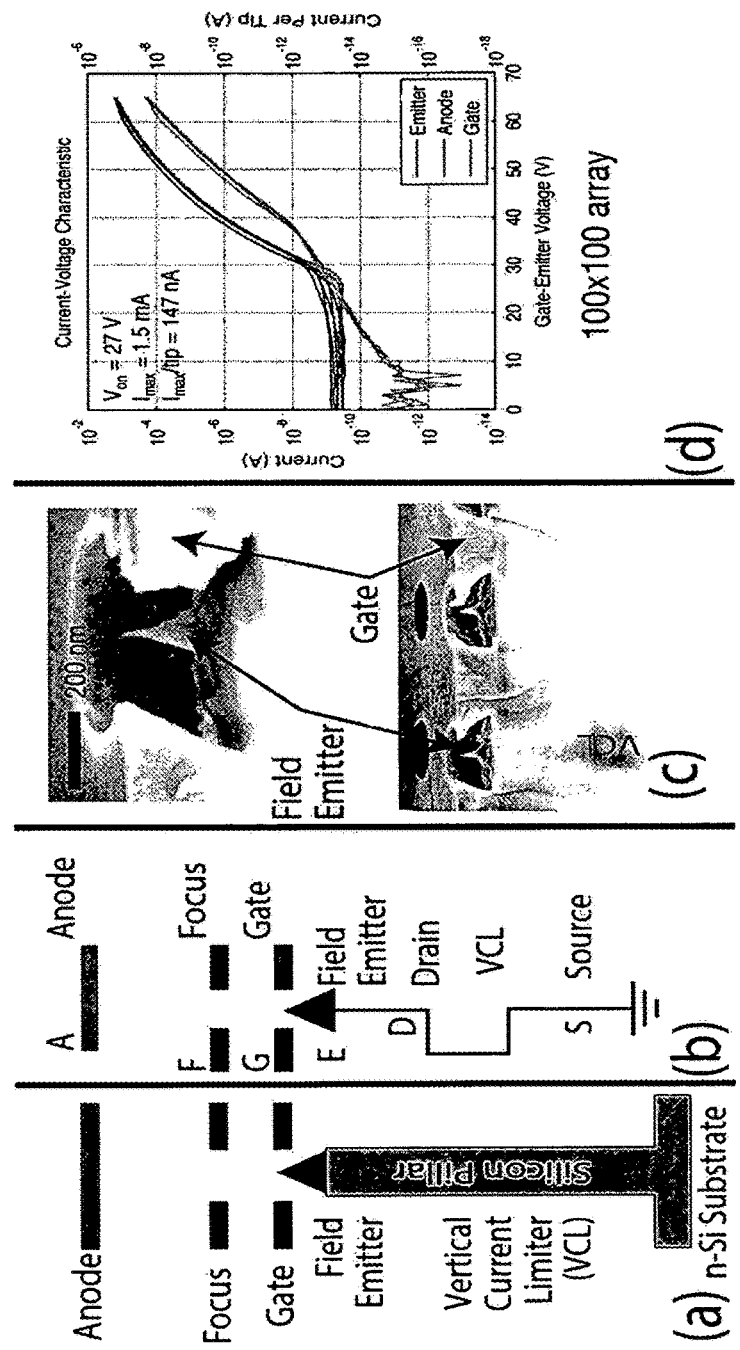
FIGS. 17A-17D show an example schematic diagram (17A), circuit diagram (17B), scanning electron microscope image (17C), and current-gate emitter voltage characteristics and Fowler-Nordheim plot of anode current (17D), according the principles herein.

FIG. 16 shows the results of a simulation of the current-voltage characteristics of 320,000 tip field ionizer array with the average radius of 8 nm and standard deviation of 1.4 nm. The leading edge of the distribution has larger tip radius than the distribution in FIG. 13 by about 2.5 nm (with the same standard deviation). A lot more tips partake in field ionization though at a moderately higher voltage. The turn-on voltage for field ionization could increase. If all our tips saturate and attain supply limited field ionization, analysis and calculations suggest that a current of 60 nA/tip at 1 Torr and 60 pA/tip at 1 mTorr could be obtained. The example compact ion beam sources herein also could be used as ionizers for mass spectrometers and micro vacuum pumps. The ion current scales with both pressure and electron current. For the sealed tube operation of the example compact ion beam sources herein, the pressure could be reduced to about 2 mTorr. An electron current of 32 mA can be used to generate an ion current of about 500 mA. An electron impact ionizer may be damaged by back streaming ion. An example compact ion beam sources herein can be configured to mitigate the back streaming ion using as the double gated FEA.

FIGS. 17A-17D show (A) an example schematic diagram of a single field emitter ballasted by an ungated FET, (B) an example circuit diagram of the VCL-FEA structure, (C) example SEMs of the completed VCL-FEA structure, and (D) a plot of the anode current-gate emitter voltage characteristics and FN plot of the anode current.

An example of fabrication of arrays of self-aligned double gate field emitter tips with high aspect ratio is as follows. The example array has a tip-to-tip spacing of 1 μm, emitter column diameters of 0.1 μm and column height of 10 μm resulting in aspect ratio of 100. Self-aligned gates can be fabricated by filling the gap between the emitter tips using conformal films of $SiO_2$ and $Si_3N_4$. The conformal insulator layers can be planarized by chemical mechanical polishing (CMP). A doped poly silicon gate layer can be defined by poly-silicon deposition and CMP planarization to open up the apertures resulting in the example emitter element shown in FIG. 17. An example ion beam source based on these arrays can demonstrate high current density for Si FEAs (82 A/cm$^2$) and high current per tip (0.7 mA/tip). In another example, the array can be fabricated with emitter elements column height of 10 μm but increased tip-to-tip spacing of about 2.5 μm and the column diameter to 250 nm. In another example, the array can be formed with a tip-to-tip spacing of a lower value, such as but not limited to about 1 μm. In another example, in place of a second gate, a mesh global electrode that is not integrated can be used to protect the emitter tips from back streaming ions. This may cause increased power dissipation from interception of electrons by the mesh.

The back streaming ions could cause damage and blunt the emitter tips and thus reduce ionization current. Using the double gated field emission/ionization structures can mitigate the back streaming ions. In an example, a self-aligned second gate (focus) can be integrated above the plane of the first gate (extraction gate) and emitter tip. In another example, a mesh global electrode that is not integrated nor self-aligned could be used to protect the emitter tips from back streaming ions. A second gate (focus) could be biased at a voltage lower than the first gate and could serve the dual purpose of focusing emitted electrons and capturing or deflecting back streaming ions. In field ionization arrays, the second gate (focus) could serve the purpose of collimating ions that are generated at the emitter tip.

In an example, the self-aligned gate of the field emitter/ionizer structure can be supported by a dielectric stack including $SiO_2$ [$E_G$=9 eV] and $Si_3N_4$ [$E_G$=5 eV] that have reasonably high bandgap. When a voltage is applied between the gate and the emitter tip substrate, a field appears across the insulator stack, and it has a trapezoidal shape with barriers occurring at the insulator metal interface. In this case, it is the conduction band discontinuity between Si and $SiO_2$. At high voltages, the field is sufficiently high to form a triangular barrier leading electrons to tunnel from the Si conduction band to the conduction band of $SiO_2$. The mobility of electrons (or holes) in $SiO_2$ can be low and furthermore there is inelastic scattering from energetic electrons leading to damage of the $SiO_2$ and formation of traps, trapping of carriers and charge buildup. At higher fields, avalanche multiplication occurs and more charge is built up and trapped. When the charge build up reaches a critical level, catastrophic breakdown of the insulator stack can occur. In order to prevent the breakdown of the insulator stack, thick dielectric films can be used to reduce the electrostatic field in the oxide. Fabrication processes are provided that maintain small gate apertures in order to keep the field factor high and operating voltage low. In an example, the dielectric layers of the emitter arrays can be about 10 µm thick, in contrast to typical values of 2.5 µm.

Figure 18:
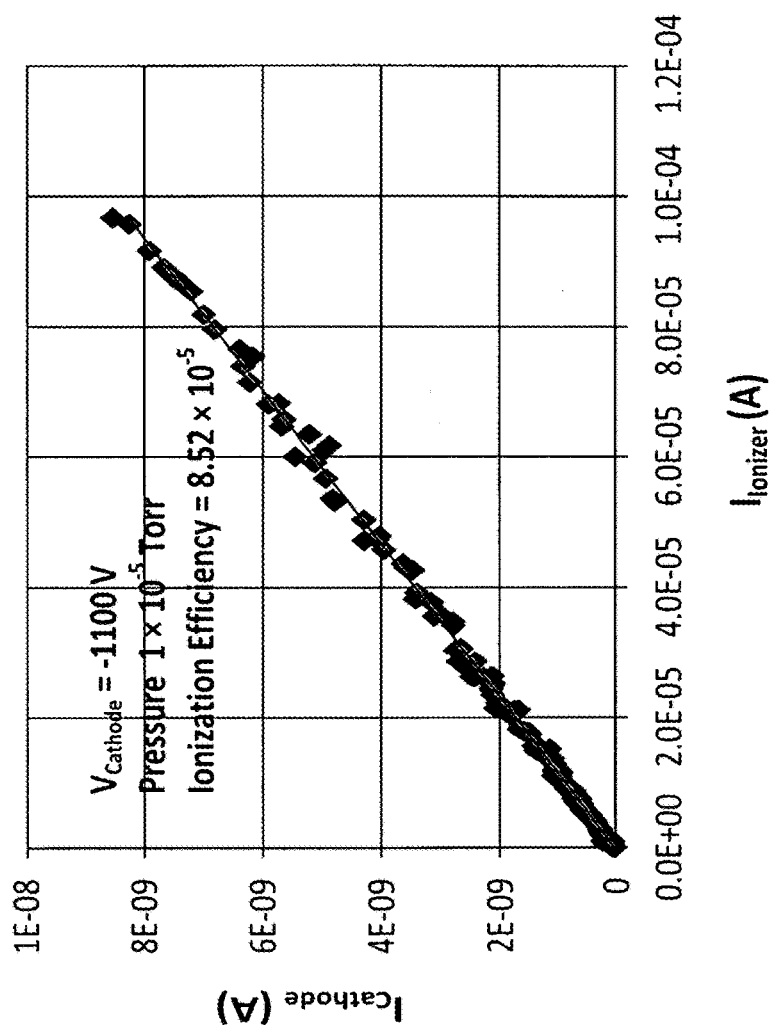
FIG. 18 shows a plot of an example ionization efficiency for the example electron impact ionizer pump of FIG. 11, according the principles herein.

FIG. 18 shows a plot of an example ionization efficiency for the example electron impact ionizer pump shown in FIG. 11. The ionization efficiency ($I_{ion}/I_E$) is ≈$10^{-4}$ over a wide pressure range. The ionization efficiency is about 0.0001 at $10^{-5}$ Torr, as shown in FIG. 18. An extrapolation of these results to 1 mTorr suggest that an ionization efficiency of 0.01 can be obtained. See, e.g., A. A. Fomani et al, "Challenges of High Vacuum Pumping based on Impact Ionization and Ion Implantation Process," Technical Digest of the 27th International Vacuum Nanoelectronics Conference, July 2014, p. 210.

The example compact ion beam sources including the dense arrays of silicon nanowires embedded in a dielectric matrix have a potentially broad range of applications, including electronics and optoelectronic devices. The example compact ion beam sources allows for many novel new application that were not possible previously based on some of the existing technology.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways, including through implementations provided in FIGS. 1 to 18 attached hereto. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A compact ion beam source comprising:
an electron beam unit, comprising:
a modular housing unit that is selectively impermeable to gasses including oxidizing gaseous molecules, the modular housing unit comprising:
a base portion; and
a membrane window made of a single monolayer two-dimensional material and selectively transmissive to electrons;
an electron beam source disposed in the modular housing unit, the electron beam source comprising:
at least one field emitter element disposed over the base portion, comprising:
a first end that is proximate to the base portion; and
a field emitter tip disposed proximate to a second end that is opposite to the first end; and
at least one gate electrode disposed proximate to the second end of the at least one field emitter element, to apply a potential difference proximate to the field emitter tip of the at least one field emitter elements, thereby extracting electrons from the at least one field emitter tip to form an electron beam; and
at least one anode component disposed in the modular housing unit and configured to accelerate the electron beam in a path directed at the membrane window of the modular housing unit.

2. The compact ion source of claim 1, wherein the electron beam source comprises a current channel region disposed at the first end of the at least one field emitter element proximate to the base portion.

3. The compact ion source of claim 1, further comprising a chemical species source disposed proximate to the membrane window of the electron beam unit, the chemical species source providing at least one chemical species that is ionizable on exposure to the electron beam to produce an ion beam.

4. The compact ion source of claim 3, further comprising a neutron-rich target material disposed in an emission path of the ion beam.

5. The compact ion source of claim 4, wherein the neutron-rich target material is a triatiated or deuterated target material.

6. The compact ion source of claim 1, wherein the membrane window forms a hermetic seal with the modular housing unit.

7. The compact ion source of claim 1, wherein the region between the membrane window and the field emitter tip further comprises an inert gas.

8. The compact ion source of claim 1, wherein the at least one field emitter element comprises a donor-doped region or an acceptor-doped region disposed at the second end.

9. The compact ion source of claim 1, wherein the membrane window is made of a single atomic layer two-dimensional material.

10. The compact ion source of claim 1, wherein the membrane window comprises graphene and/or silicene.

11. The compact ion source of claim 1, wherein the two-dimensional material is a two-dimensional allotrope.

12. A compact ion beam source comprising:
a modular housing unit comprising a membrane window made of a single monolayer two-dimensional material and a base portion; and
at least one field emitter element disposed over the base portion, comprising:
a first end that is proximate to the base portion;
a field emitter tip disposed proximate to a second end that is opposite to the first end;
at least one gate electrode disposed proximate to the second end of the at least one field emitter element; and
a vertical transistor disposed between the first and the second end of the at least one field emitter element.

13. The compact ion source of claim 12, further comprising at least one chemical species disposed proximate to the field emitter tip, the at least one chemical species being ionizable to produce an ion beam in response to application of a potential difference between the field emitter tip and the at least one gate electrode.

14. The compact ion source of claim 13, further comprising a neutron-rich target material disposed in an emission path of the ion beam.

15. The compact ion source of claim 12, wherein the region between the membrane window and the field emitter tip further comprises an inert gas.

16. The compact ion source of claim 12, wherein the at least one field emitter element comprises a donor-doped region or an acceptor-doped region disposed at the second end.

17. The compact ion source of claim 12, further comprising at least one collector component disposed in the modular housing unit and configured to apply a lower potential than the gate electrode to accelerate the ion beam.

18. The compact ion source of claim 12, wherein the membrane window is made of a single atomic layer two-dimensional material.

19. The compact ion source of claim 18, wherein the membrane window forms a hermetic seal of the modular housing unit, and wherein the modular housing unit is selectively impermeable to gasses including oxidizing gaseous molecules.

20. The compact ion source of claim 12, wherein the membrane window comprises graphene and/or silicene.

* * * * *